United States Patent
Kaneko

(10) Patent No.: US 6,950,367 B2
(45) Date of Patent: Sep. 27, 2005

(54) MEMORY EMBEDDED LOGIC INTEGRATED CIRCUIT MOUNTING MEMORY CIRCUITS HAVING DIFFERENT PERFORMANCES ON THE SAME CHIP

(75) Inventor: Tetsuya Kaneko, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/151,805

(22) Filed: May 22, 2002

(65) Prior Publication Data

US 2003/0185085 A1 Oct. 2, 2003

(30) Foreign Application Priority Data

Mar. 26, 2002 (JP) ........................................ 2002-086679

(51) Int. Cl.[7] ................................................. G11C 8/00
(52) U.S. Cl. ................... 365/230.03; 365/63; 365/149; 365/189.09
(58) Field of Search ........................... 365/230.03, 226, 365/222, 63, 51, 145, 149, 189.09

(56) References Cited

U.S. PATENT DOCUMENTS

| | | | | |
|---|---|---|---|---|
| 5,617,369 A | * | 4/1997 | Tomishima et al. | 365/230.06 |
| 5,680,363 A | * | 10/1997 | Dosaka et al. | 365/230.03 |
| 5,959,923 A | * | 9/1999 | Matteson et al. | |
| 5,999,474 A | * | 12/1999 | Leung et al. | 365/222 |
| 6,038,178 A | * | 3/2000 | Oh | 365/189.09 |
| 6,064,621 A | * | 5/2000 | Tanizaki et al. | 365/230.03 |
| 6,326,265 B1 | | 12/2001 | Liu et al. | |
| 2001/0034093 A1 | | 10/2001 | Matsuzaki et al. | |

FOREIGN PATENT DOCUMENTS

| | | |
|---|---|---|
| JP | 3-194790 | 8/1991 |
| JP | 10-40243 | 3/1998 |
| JP | 10-135424 | 5/1998 |
| JP | 11-96766 | 4/1999 |
| KR | 1997-0077638 | 12/1997 |
| KR | 1998-033971 | 5/1998 |
| KR | 1999-014158 | 2/1999 |

OTHER PUBLICATIONS

Nikkei Microdevices, Jun. 1995, pp. 66–73.

* cited by examiner

Primary Examiner—Son T. Dinh
(74) Attorney, Agent, or Firm—Oblon, Spivak, McClelland, Maier & Neustadt, P.C.

(57) ABSTRACT

A semiconductor integrated circuit includes a first DRAM circuit having a first memory cell array having a plurality of memory cells each including a first MOS transistor, and a first potential generating circuit which generates at least one potential used to operate the plurality of memory cells in the first memory cell array, the first DRAM circuit being formed in a semiconductor chip, and a second DRAM circuit having a second memory cell array having a plurality of memory cells each including a second MOS transistor different in characteristic from the first MOS transistor, and a second potential generating circuit which generates at least one potential used to operate the plurality of memory cells in the second memory cell array, the second DRAM circuit being formed in the semiconductor chip.

70 Claims, 10 Drawing Sheets

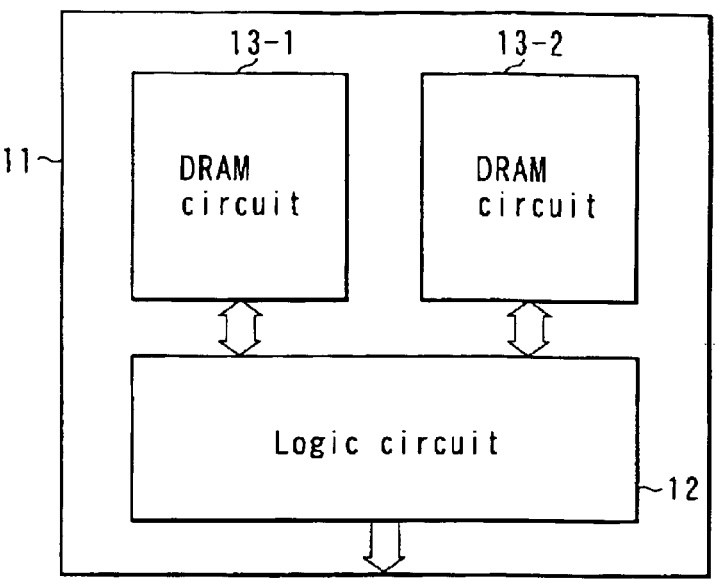
FIG. 1
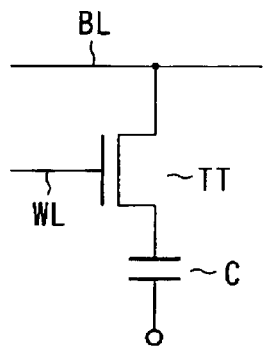
FIG. 3
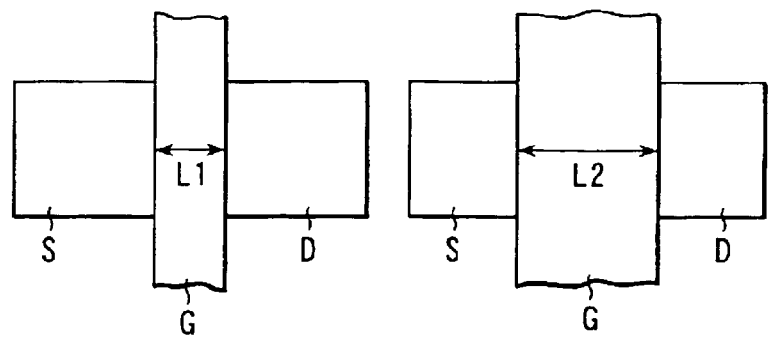
FIG. 4A          FIG. 4B
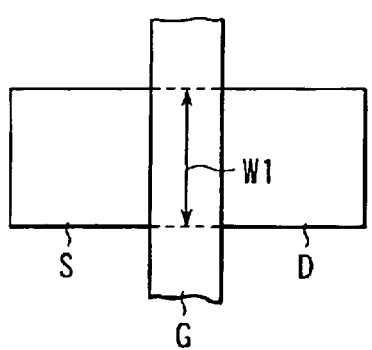   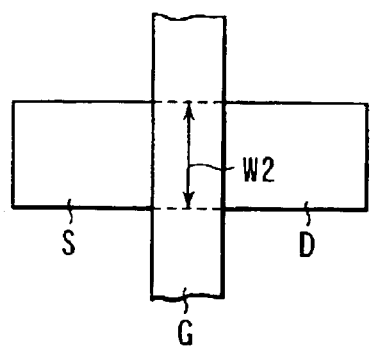
FIG. 5A          FIG. 5B

MEMORY EMBEDDED LOGIC INTEGRATED CIRCUIT MOUNTING MEMORY CIRCUITS HAVING DIFFERENT PERFORMANCES ON THE SAME CHIP

CROSS-REFERENCE TO RELATED APPLICATIONS

This application is based upon and claims the benefit of priority from the prior Japanese Patent Application No. 2002-086679, filed Mar. 26, 2002, the entire contents of which are incorporated herein by reference.

BACKGROUND OF THE INVENTION

1. Field of the Invention

The present invention relates to a semiconductor integrated circuit and, more particularly, to a memory embedded logic integrated circuit mounting memory circuits having different performances on the same semiconductor chip.

2. Description of the Related Art

Recently, the importance of semiconductor integrated circuits called system LSIs is increasing. Conventionally, semiconductor chips are separated in units of functions. An LSI in which most of these functions are integrated in one chip is called a system LSI. Of these system LSIs, memory embedded logic LSIs in which a memory circuit and logic circuit are integrated in one chip have been particularly extensively developed in recent years.

One great merit of integrating a memory circuit and logic circuit in one chip is low power consumption. Since a memory circuit and logic circuit are integrated in one chip, no I/O buffers need be formed between these two circuits. This reduces the power consumption required for charge/discharge by these I/O buffers.

In addition, since the bus width can be increased, the data transfer rate can be raised even if the operating frequency is lowered. This also reduces the power consumption.

For example, when in digital apparatuses for consumers a memory is formed in a different chip as in the conventional devices, the power consumption cannot be lower to 1 W or less. Accordingly, expensive packages and heat sinks are required to increase the heat radiation characteristic. This extraordinarily increases the fabrication cost. Embedding a memory in the same chip is necessary to use conventional inexpensive plastic packages.

Another merit of integrating a memory circuit and logic circuit in one chip is a high operating speed. The bus width of a general-purpose memory is at most about 32 bits, and its operating frequency is about 200 MHz. Hence, the data transfer rate cannot be greatly increased.

In a memory embedded logic LSI, the bus width can be readily increased to about 256 bits. Accordingly, the data transfer rate can be made much higher than that of the general-purpose memory even at the same operating frequency as that of the general-purpose memory.

Of memory embedded logic LSIs, particularly DRAM (Dynamic Random Access Memory) embedded logic LSIs have been put into practical use since around 1996 for high-performance applications such as image processing in engineering workstations and in high-performance personal computers. Embedding a DRAM in the same chip increases the band width of a memory bus and can greatly increase the processability.

Recently, DRAM embedded logic LSIs are beginning to be extensively used in image apparatuses such as digital video cameras and still cameras, storage media such as a DVD (Digital Video Disk), and portable information terminals. In these apparatuses, the use of DRAM embedded logic LSIs enhances the effect of reducing the power consumption and the mounting area.

Since system LSIs are used in various applications as described above, DRAMs to be mounted on these system LSIs are also required to have various performances in accordance with these applications. For example, in dry-cell-driven digital apparatuses for consumers, low power consumption is required more than a high operating speed. In image processing, a large memory scale is necessary. In recent three-dimensional image processing and signal processing for communication systems, demands for high-speed access are increasing. In the future, development may progress to integrate a system of a much larger scale on one chip.

In a case like this, memory circuits formed in the same chip may be required to have one memory circuit in which the integration degree is given high priority and another memory circuit in which the operating speed is given high priority. For example, two DRAM circuits integrated in a system LSI are required to have different performances; one is required to have a high access speed, and the other is required to give preference to the data holding characteristic and the integration degree rather than to the access time.

DRAM circuits mounted on conventional DRAM embedded logic LSIs are so fabricated as to have performances meeting as many product requirements as possible. Therefore, the memory capacity, data bus width, operating frequency, read latency, address assignment method, and bank configuration can be changed in accordance with the product specification in many cases.

However, these DRAM circuits cannot be adapted to changes in the performance of a memory cell array itself. That is, memory cells used in two types of DRAM circuits integrated on the same chip have the same performance.

This expectedly makes it difficult to meet product requirements to be more and more diversified in the future.

As described above, in the conventional semiconductor integrated circuit in which a plurality of different types of memory circuits are integrated in the same chip, the performances of memory cells used in these memory circuits are the same. This makes diverse product requirements difficult to satisfy.

BRIEF SUMMARY OF THE INVENTION

According to an aspect of the present invention, there is provided a semiconductor integrated circuit comprises a first memory circuit having a first memory cell array having a plurality of memory cells each including a first MOS transistor, and a first potential generating circuit which generates at least one potential used to operate the plurality of memory cells in the first memory cell array, the first memory circuit being formed in a semiconductor chip, and at least one second memory circuit having a second memory cell array having a plurality of memory cells each including a second MOS transistor different in characteristic from the first MOS transistor, and a second potential generating circuit which generates at least one potential used to operate the plurality of memory cells in the second memory cell array, the at least one second memory circuit being formed in the same semiconductor chip as the first memory circuit.

BRIEF DESCRIPTION OF THE SEVERAL VIEWS OF THE DRAWING

FIG. 1 is a block diagram showing an outline of the arrangement of a memory embedded logic LSI according to the first embodiment of the present invention;

FIG. 3 is a circuit diagram showing one memory cell in a memory cell array shown in FIG. 2;

FIGS. 4A and 4B are plan views of two types of transfer transistors different in channel length, formed in the first and second DRAM circuits shown in FIG. 1;

FIGS. 5A and 5B are plan views of two types of transfer transistors different in channel width, formed in the first and second DRAM circuits shown in FIG. 1;

DETAILED DESCRIPTION OF THE INVENTION

Figure 2:
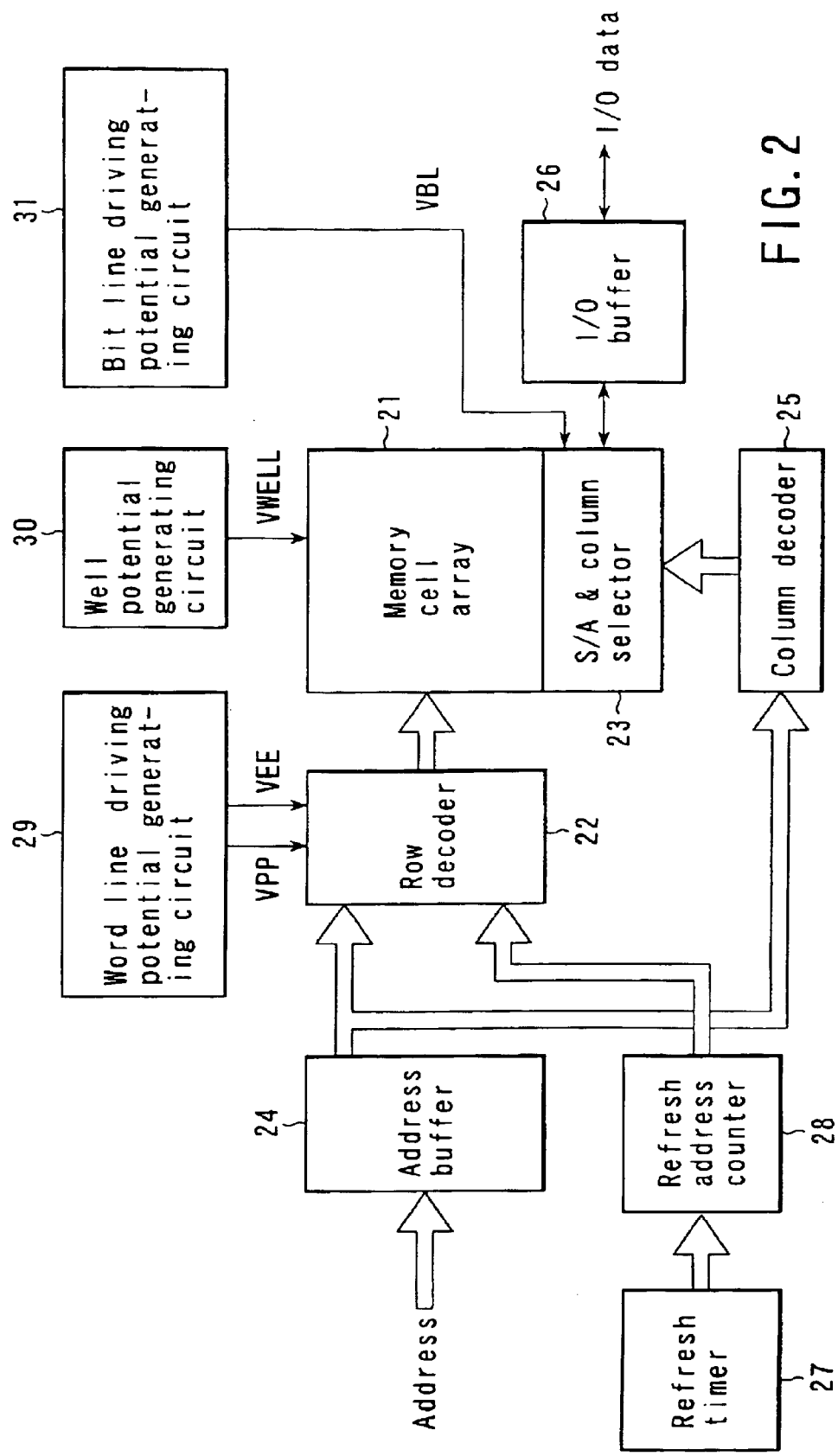
FIG. 2 is a block diagram showing the internal arrangement of first and second DRAM circuits shown in FIG. 1.

Embodiments of the present invention will be described in detail below with reference to the accompanying drawing.

(First Embodiment)

FIG. 1 shows an outline of the arrangement of a memory embedded logic LSI according to the first embodiment of the present invention. In a semiconductor chip 11, a logic circuit 12 and a plurality of memory circuits 13 are integrated. In this embodiment, first and second DRAM circuits 13-1 and 13-2 are integrated as examples of the memory circuits 13. However, one or more of each of three or more types of DRAM circuits can also be integrated. This similarly applies to each of the following embodiments, so a detailed explanation thereof will be omitted.

This embodiment will be explained by taking a case in which the first and second DRAM circuits 13-1 and 13-2 are integrated as the memory circuits 13. However, instead of these DRAM circuits, it is also possible to integrate SRAM circuits, nonvolatile memory circuits such as flash memories, ferroelectric memory circuits, or magnetic memory circuits, as the memory circuits 13. This similarly applies to each of the following embodiments, so a detailed explanation thereof will be omitted.

The first and second DRAM circuits 13-1 and 13-2 exchange data with the logic circuit 12. For example, data supplied from the outside of the semiconductor chip 11 is supplied to the first or second DRAM circuit 13-1 or 13-2 after being subjected to predetermined logic processing by the logic circuit 12, or without being subjected to this logic processing, and is stored in the first or second DRAM circuit 13-1 or 13-2.

Data read out from the first or second DRAM circuit 13-1 or 13-2 is supplied to the logic circuit 12. This readout data from the first or second DRAM circuit 13-1 or 13-2 is output to the outside of the semiconductor chip 11 after being subjected to predetermined logic processing by the logic circuit 12, or without being subjected to this logic processing.

As will be described later, memory cell arrays are formed in the first and second DRAM circuits 13-1 and 13-2. These memory cell arrays formed in the first and second DRAM circuits 13-1 and 13-2 are so configured as to have different performances in accordance with specifications required as products.

Examples of the required specifications are that high priority is given to a high-speed access operation, and that preference is given to the integration degree and the data holding characteristic in a memory cell rather than the access time. Examples of numerals indicating the electrical characteristics appearing in specifications are the refresh period and the random access time.

In the DRAM embedded logic LSI of this first embodiment, the first and second DRAM circuits 13-1 and 13-2 integrated on the same semiconductor chip 11 have memory cell arrays different in random access time.

The first and second DRAM circuits 13-1 and 13-2 shown in FIG. 1 have equivalent configurations on a block diagram level. Accordingly, the configuration of one of the first and second DRAM circuits 13-1 and 13-2 will be explained with reference to FIG. 2, and an explanation of the other will be omitted.

A plurality of memory cells are formed in a memory cell array 21. These memory cells are formed in a plurality of well regions in each DRAM circuit. These well regions formed in each DRAM circuit are electrically connected and set at the same potential in the DRAM circuit. Each memory cell is connected to one of a plurality of word lines and one of a plurality of bit lines.

The word lines are selectively driven by an output from a row decoder 22. The bit lines are connected to a sense amplifier (S/A) & column selector circuit 23. A potential change generated on a bit line when a memory cell is accessed and data is read out from the memory cell is amplified by a sense amplifier of the sense amplifier (S/A) & column selector circuit 23, and the data is sensed.

An address buffer 24 receives a row address and column address. The row address is supplied to the row decoder 22, and the column address is supplied to a column decoder 25. In accordance with this column address, the column decoder 25 selectively drives the bit lines to select a column.

In data read, data of a column selected by the column decoder 25 is output, from the data sensed by the sense amplifier & column selector circuit 23, to the outside of the DRAM circuit via an I/O buffer 26. In data write, write data supplied from the outside of the DRAM circuit via the I/O buffer 26 is supplied to a column selected by the column decoder 25, supplied to a memory cell via a bit line, and written in the memory cell.

The DRAM circuit also has a refresh timer 27 and a refresh address counter 28 in order to refresh data stored in memory cells in the memory cell array 21 at a predetermined period. These refresh timer 27 and refresh address counter 28 configure a refresh control circuit.

The refresh timer 27 generates a timer signal having a predetermined period. The refresh address counter 28 counts this timer signal to generate a row address for refresh. This row address for refresh is supplied to the row decoder 22.

In addition, the DRAM circuit includes a word line driving potential generating circuit 29, a well potential generating circuit 30, and a bit line driving potential generating circuit 31.

The word line driving potential generating circuit 29 generates a positive potential VPP used to select word lines in the memory cell array 21, and a negative potential VEE to be supplied to non-selected word lines. These potentials VPP and VEE are supplied to the row decoder 22.

The well potential generating circuit 30 generates a negative well potential VWELL to be applied to p-type well regions in which memory cells are formed in the memory cell array 21.

The bit line driving potential generating circuit 31 generates a positive read potential VBL to be applied to a bit line, when data is to be read out from a memory cell in the memory cell array 21. This potential VBL is supplied to the sense amplifier & column selector circuit 23.

As shown in FIG. 2, the first and second DRAM circuits 13-1 and 13-2 independently have the word line driving potential generating circuit 29, well potential generating circuit 30, and bit line driving potential generating circuit 31 for generating various potentials used to operate memory cells in the memory cell array 21. This configuration is different from the conventional arrangement in which memory cells in the memory cell array 21 are simply divided into blocks and a row decoder and column decoder are formed for each block.

FIG. 3 shows one memory cell in the memory cell array 21. This memory cell MC is composed of a transfer transistor TT which is a MOS transistor, and a capacitor C for storing data. The drain of the transfer transistor TT is connected to one of a plurality of bit lines BL. The gate electrode of the transfer transistor TT is connected to one of a plurality of word lines WL. One terminal of the capacitor C is connected to the source of the transfer transistor TT. The other terminal of the capacitor C is connected to a predetermined potential supply node, e.g., a ground potential node.

The memory cell arrays in the first and second DRAM circuits 13-1 and 13-2 are given different performances by making the driving forces, i.e., the values of the ON currents of the transfer transistors TT shown in FIG. 3 different from each other. The ON current herein mentioned is an electric current which flows between the source and drain when the transistor is ON. "Making the values of the ON currents different from each other" means that the difference between these values is not a difference within the range of variations produced during fabrication, but a significant difference between them.

Assume that the first DRAM circuit 13-1 gives high priority to a high-speed operation and requires a short random access time, and the second DRAM circuit 13-2 gives low priority to a high-speed operation and requires no such short random access time.

When the driving force of each transfer transistor TT forming the memory cell MC in the memory cell array of the first DRAM circuit 13-1 is raised, high-speed data read and write can be performed, and the random access time is shortened. The driving force of each transfer transistor TT forming the memory cell MC in the memory cell array of the second DRAM circuit 13-2 is made lower than that in the first DRAM circuit 13-1.

The driving forces of the transfer transistors TT forming the memory cells MC can be made different by changing the channel lengths, channel widths, threshold voltages, or parasitic resistance values of the transistors.

FIGS. 4A and 4B are plan views of the transfer transistors TT in the first and second DRAM circuits 13-1 and 13-2 when the driving forces are made different by changing the channel lengths of the transistors. Each transfer transistor TT is composed of a source diffusion layer S, a drain diffusion layer D, and a gate electrode G formed over a portion between these source and drain diffusion layers.

A channel length L1 of the transfer transistor TT in the first DRAM circuit 13-1 is made shorter than a channel length L2 of the transfer transistor TT in the second DRAM circuit 13-2.

In the memory cell array of the first DRAM circuit 13-1 in which the transfer transistor TT having the short channel length is formed, the value of the ON current of the transfer transistor TT increases. Accordingly, the memory cell array of this first DRAM circuit 13-1 allows a high-speed access operation, and this shortens the random access time.

On the other hand, in the memory cell array of the second DRAM circuit 13-2 in which the transfer transistor TT having the long channel length is formed, the value of the ON current of the transfer transistor TT is smaller than that in the first DRAM circuit 13-1. Therefore, the access operation of this memory cell array in the second DRAM circuit 13-2 slows down to prolong the random access time.

That is, the driving forces, i.e., the ON current values of the transistors constructing the memory cells in the first and second DRAM circuits 13-1 and 13-2 can be changed by changing the channel lengths of these transistors in accordance with the respective required specifications. As a consequence, the performances of the first and second DRAM circuits 13-1 and 13-2 can be made different from each other.

FIGS. 5A and 5B are plan views of the transfer transistors TT in the first and second DRAM circuits 13-1 and 13-2 when the driving forces are made different by changing the channel widths of the transistors.

A channel width W1 of the transfer transistor TT in the first DRAM circuit 13-1 is made larger than a channel width W2 of the transfer transistor TT in the second DRAM circuit 13-2.

In the memory cell array of the first DRAM circuit 13-1 in which the transfer transistor TT having the large channel width is formed, the value of the ON current of the transfer transistor TT increases. Accordingly, the memory cell array of this first DRAM circuit 13-1 allows a high-speed access operation, and this shortens the random access time.

On the other hand, in the memory cell array of the second DRAM circuit 13-2 in which the transfer transistor TT having the small channel width is formed, the value of the ON current of the transfer transistor TT is smaller than that in the first DRAM circuit 13-1. Therefore, the access operation of this memory cell array in the second DRAM circuit 13-2 slows down to prolong the random access time.

That is, the driving forces, i.e., the ON current values of the transistors constructing the memory cells in the first and second DRAM circuits 13-1 and 13-2 can be changed by changing the channel widths of these transistors in accordance with the respective required specifications. As a consequence, the performances of the first and second DRAM circuits 13-1 and 13-2 can be made different from each other.

A method by which the driving forces of the transfer transistors TT are made different by changing the film thicknesses of gate insulating films of these transistors will be explained below.

Figure 6A:
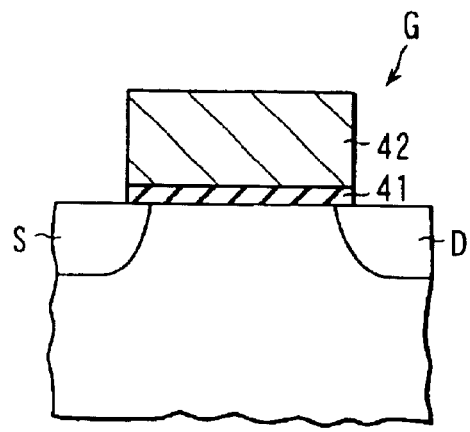
FIGS. 6A and 6B are plan views of two types of transfer transistors different in film thickness of an insulating film, formed in the first and second DRAM circuits shown in FIG. 1.
Figure 6B:
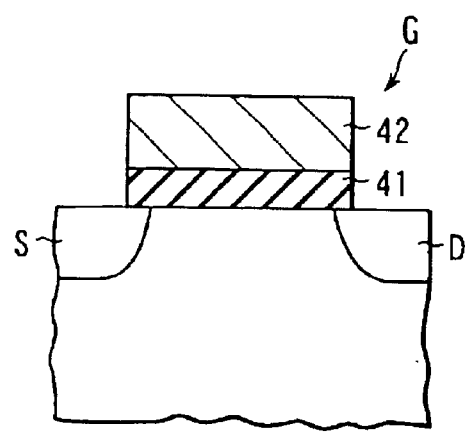

FIGS. 6A and 6B illustrate schematic sectional structures of the transfer transistors TT in the first and second DRAM circuits 13-1 and 13-2, when the driving forces of the transfer transistors TT are made different from each other by changing the film thicknesses of gate insulating films of these transistors.

Each transfer transistor TT is composed of a source diffusion layer S, a drain diffusion layer D, and a gate electrode G formed over a portion between these source and drain diffusion layers. This gate electrode G includes a gate insulating film 41 formed on the substrate and a gate conductor layer 42 which is a polysilicon layer or metal layer formed on the gate insulating film 41.

The film thickness of the gate insulating film 41 of the transfer transistor TT in the first DRAM circuit 13-1 is made smaller than that of the gate insulating film 41 of the transfer transistor TT in the second DRAM circuit 13-2. Note that the gate insulating films 41 of these transistors are made of the same material and have the same dielectric constant.

In the memory cell array of the first DRAM circuit 13-1 in which the transfer transistor TT having the thin gate insulating film 41 is formed, the value of the ON current of the transfer transistor TT increases. Accordingly, the memory cell array of this first DRAM circuit 13-1 allows a high-speed access operation, and this shortens the random access time.

On the other hand, in the memory cell array of the second DRAM circuit 13-2 in which the transfer transistor TT having the thick gate insulating film 41 is formed, the value of the ON current of the transfer transistor TT is smaller than that in the first DRAM circuit 13-1. Therefore, the access operation of this memory cell array in the second DRAM circuit 13-2 slows down to prolong the random access time.

That is, the driving forces, i.e., the ON current values of the transistors constructing the memory cells in the first and second DRAM circuits 13-1 and 13-2 can be changed by changing the film thicknesses of the insulating films of these transistors in accordance with the respective required specifications. As a consequence, the performances of the first and second DRAM circuits 13-1 and 13-2 can be made different from each other.

Another method of making the driving forces of the transistors different from each other will be explained below. The driving forces of the transistors can be made different by changing their threshold voltages, and the threshold voltages can be changed by changing the impurity concentrations in the channel regions.

Figure 7A:
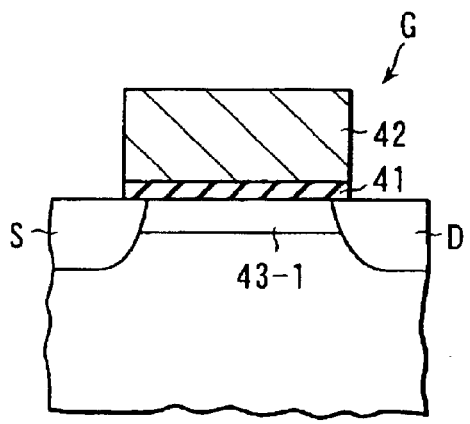
FIGS. 7A and 7B are plan views of two types of transfer transistors different in impurity concentration in a channel region, formed in the first and second DRAM circuits shown in FIG. 1.
Figure 7B:
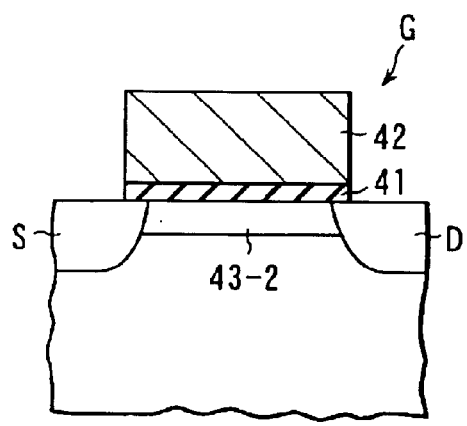

FIGS. 7A and 7B illustrate schematic sectional structures of the transfer transistors TT in the first and second DRAM circuits 13-1 and 13-2, when the threshold voltages are changed by changing the impurity concentrations in the channel regions of the transistors, thereby making the driving forces different from each other.

Generally, an impurity having the same conductivity type as the substrate is doped into a channel region between the source and drain diffusion layers of the transfer transistor TT, in order to control the threshold voltage.

As shown in FIGS. 7A and 7B, the same impurity having the same conductivity type as the substrate is doped into the channel regions of the transfer transistors TT formed in the first and second DRAM circuits 13-1 and 13-2. The impurity concentration in a channel region 43-1 of the transfer transistor TT in the first DRAM circuit 13-1 is made lower than that in a channel region 43-2 of the transfer transistor TT in the second DRAM circuit 13-2.

In the memory cell array of the first DRAM circuit 13-1 in which the impurity concentration in the channel region 43-1 is low, the value of the ON current of the transfer transistor TT increases. Accordingly, the memory cell array of this first DRAM circuit 13-1 allows a high-speed access operation, and this shortens the random access time.

On the other hand, in the memory cell array of the second DRAM circuit 13-2 in which the impurity concentration in the channel region 43-2 is high, the value of the ON current of the transfer transistor TT is smaller than that in the first DRAM circuit 13-1. Therefore, the access operation of this memory cell array in the second DRAM circuit 13-2 slows down to prolong the random access time.

That is, the driving forces, i.e., the ON current values of the transistors constructing the memory cells in the first and second DRAM circuits 13-1 and 13-2 can be changed by changing the threshold voltages of these transistors in accordance with the respective required specifications. As a consequence, the performances of the first and second DRAM circuits 13-1 and 13-2 can be made different from each other.

When the channel length of the transistor is decreased, the channel width of the transistor is increased, or the threshold voltage of the transistor is lowered, a leakage current of the transistor increases, and this worsens the data holding characteristic of the memory cell. Also, if the channel width of the transistor is increased to give preference to a high-speed operation, the memory cell size increases, and this lowers the degree of integration.

Accordingly, if, as in the conventional devices, transfer transistors having the same configuration are used in both cases in which the degree of integration and the data holding characteristic have preference and in which a high-speed operation has preference, these two requirements are difficult to satisfy at the same time.

By contrast, in the first embodiment, a memory cell array used in a DRAM circuit in which high priority is given to the degree of integration and a memory cell array used in a DRAM circuit in which high priority is given to a high-speed operation are made different from each other by changing the values of the ON currents of transistors in memory cells, thereby giving these memory cell arrays the respective suitable configurations. This makes it possible to fabricate DRAM circuits having different performances on the same semiconductor chip, and to solve the conventional problems.

(Second Embodiment)

In the first embodiment, memory cell arrays in two or more types of DRAM circuits are given different performances by making the values of the ON currents of transfer transistors different from each other.

However, memory cell arrays in two or more types of DRAM circuits can also be given different performances by making the values of the breaking currents of transfer transistors different from each other. The breaking current herein mentioned is a leakage current which flows when a transistor is OFF.

Changing the values of the breaking currents of transfer transistors is related to changing the values of the ON currents in the first embodiment; as the ON current value increases, the breaking current value also increases.

Accordingly, the values of the breaking currents can be changed by using at least one of the means for: changing the channel lengths of transistors as shown in FIGS. 4A and 4B; changing the channel widths of transistors as shown in FIGS. 5A and 5B; changing the film thicknesses of gate insulating films of transistors as shown in FIGS. 6A and 6B; and changing the threshold voltages of transistors by changing the impurity concentrations in channel regions of the transistors as shown in FIGS. 7A and 7B.

In the second embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted.

Of the first and second DRAM circuits 13-1 and 13-2 in the DRAM embedded logic LSI of this second embodiment, a memory cell in which the breaking current of a transistor is decreased is used in a memory cell array in which the data holding characteristic is given high priority, and a memory cell in which the breaking current of a transistor is increased is used in a memory cell in which the data holding characteristic is given low priority.

Permitting a large breaking current is undesirable to the data holding characteristic. However, the breaking current often increases when the driving force of a transistor is raised. Accordingly, it is desirable to allow a relatively large breaking current in the first DRAM circuit 13-1 requiring a high-speed operation, and to suppress the breaking current by attaching importance to the data holding characteristic in the second DRAM 13-2 in which a high-speed operation is given low priority.

(Third Embodiment)

If the parasitic resistance becomes dominant over the ON resistance of a transfer transistor when memory cell data is to be read out or written, no high-speed operation is possible even if the ON resistance of the transfer transistor is lowered. Therefore, the parasitic resistance is desirably lowered in a DRAM circuit in which a high-speed operation is given high priority. For example, this parasitic resistance is lowered by: lowering the contact resistance by increasing the size of a bit line contact connecting a bit line BL and the drain diffusion layer of a transfer transistor TT shown in FIG. 3; lowering the resistivity of the diffusion layer itself of the transistor TT constructing a memory cell MC; increasing the width of the diffusion layer of the transistor; or lowering the resistive component between the diffusion layer of the transistor constructing the memory cell MC and a capacitor C forming the memory cell.

Figure 8A:
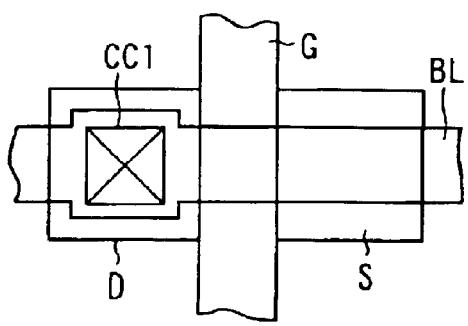
FIGS. 8A and 8B are plan views of two types of transfer transistors different in size of a bit line contact, formed in a memory embedded logic LSI according to the third embodiment of the present invention.
Figure 8B:
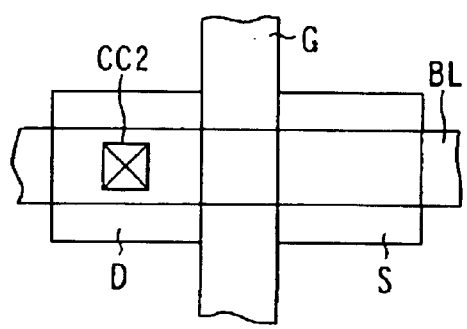

FIGS. 8A and 8B are plan views of transfer transistors TT in first and second DRAM circuits 13-1 and 13-2, when the values of the parasitic resistances of these transfer transistors TT are made different from each other by changing the sizes of bit line contacts connecting bit lines BL and the drain diffusion layers of the transfer transistors TT.

Each transfer transistor TT is composed of a source diffusion layer S, a drain diffusion layer D, and a gate electrode G formed over a portion between these source and drain diffusion layers. The bit line BL is an interconnect made of, e.g., a polysilicon layer or metal layer formed on the gate electrode G. This bit line BL and the drain diffusion layer D are connected by a bit line contact.

The area of a bit line contact CC1 of the transfer transistor TT formed in the first DRAM circuit 13-1 is made larger than that of a bit line contact CC2 of the transfer transistor TT formed in the second DRAM circuit 13-2.

In a memory cell array of the first DRAM circuit 13-1 in which the transfer transistor TT having the large bit line contact CC1 is formed, the parasitic resistance of the transistor is lower than that in a memory cell of the second DRAM circuit 13-2. Accordingly, a high-speed access operation can be performed, and this shortens the random access time.

Lowering the resistive component of the transistor is also desirable in cases other than when a high-speed operation is required. However, if this change of lowering the resistive component increases a leakage current in the diffusion layer, it is desirable to give preference to lowering the resistive component, although the leakage current more or less increases, in the first DRAM circuit 13-1 in which a high-speed operation is given high priority, and to give preference to lowering the leakage current, rather than to lowering the resistive component, in the second DRAM circuit 13-2 in which a high-speed operation is given low priority.

In the third embodiment as described above, the configurations of memory cell arrays in DRAM circuits, in one of which a high-speed operation is given high priority and in the other of which it is not, are made different from each other by changing the values of the parasitic resistances in memory cells, thereby giving these memory cell arrays the respective suitable configurations. Consequently, DRAM circuits having different performances can be fabricated on the same semiconductor chip.

(Fourth Embodiment)

In the first and second embodiments described above, memory cell arrays in two or more types of DRAM circuits integrated on the same semiconductor chip are given different performances by changing the values of the ON currents or breaking currents of transistors in memory cells.

However, memory cell arrays in two or more DRAM circuits can also be given different performances by changing the capacitance values of capacitors forming memory cells.

The fourth embodiment of the present invention in which the capacitance values of capacitors in memory cells are changed will be explained below.

In this fourth embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted.

As shown in FIG. 3, a memory cell MC in a DRAM circuit is composed of one transfer transistor TT and one capacitor C. The capacitance of the capacitor C forming the memory cell has effect on the operating speed of the memory cell array. If the parasitic resistance is negligible, the capacitance of the memory cell capacitor C is desirably as large as possible. In practice, however, the parasitic resistance cannot be ignored. Therefore, the time required for charge/discharge of the capacitor C when data read or write is performed for the memory cell is affected by the time constant which is determined by the capacitance of the memory cell capacitor C and the resistive component.

That is, when the capacitance is large, the CR delay increases to decrease the gradient of a potential change during charge/discharge, and this worsens the access time. The capacitance of the capacitor C constructing the memory cell cannot be unlimitedly decreased because this capacitance has direct influence on the signal amount.

If, however, a high-speed operation is given high priority, it is sometimes desirable to decrease the capacitance of the capacitor C forming the memory cell. If the capacitance of the capacitor forming the memory cell in a DRAM circuit which requires no high-speed operation is similarly decreased, deterioration of the data holding characteristic resulting from a decrease in the signal amount is no longer allowable.

Accordingly, in a DRAM circuit which gives high priority to a high-speed operation, a capacitor having a small capacitance is used as the capacitor forming the memory cell, even though the data holding characteristic is more or less sacrificed; in a DRAM circuit which gives no high priority to a high-speed operation, a capacitor having a large capacitance is used as the capacitor forming the memory cell. By thus selectively using capacitors, DRAMs having the respective characteristic features of these capacitors can be fabricated.

Figure 9:
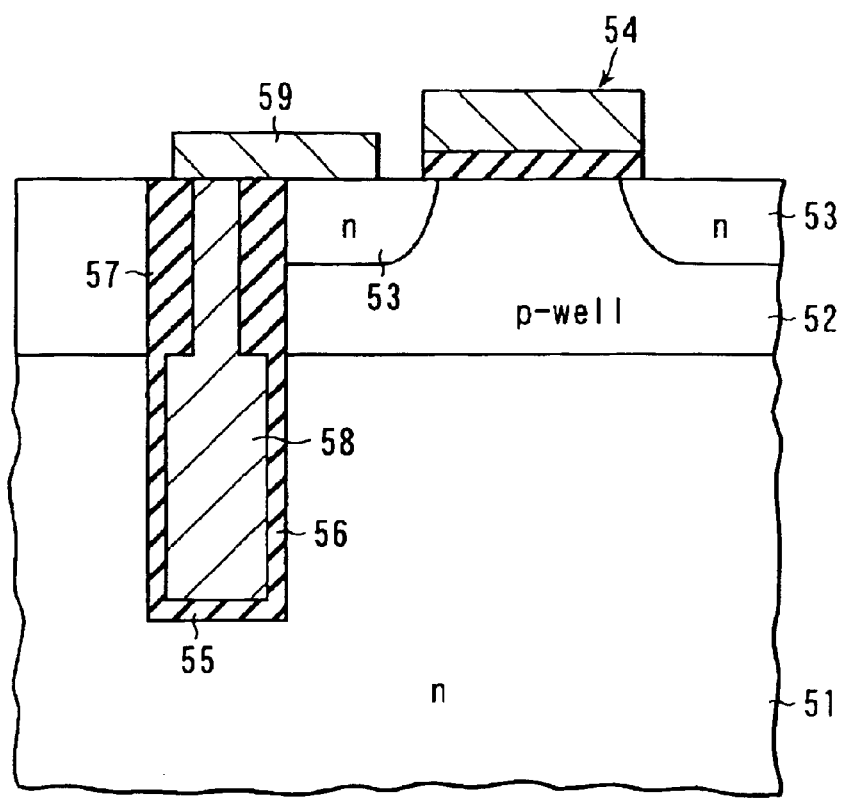
FIG. 9 is a sectional view showing an example of a whole memory cell formed in a memory embedded logic LSI according to the fourth embodiment of the present invention.

FIG. 9 shows an example of the sectional structure of a whole memory cell MC shown in FIG. 3. A p-type well region (p-well) 52 is formed on an n-type substrate 51. On the surface of the well region 52, a pair of n-type diffusion layers 53 serving as the source and drain diffusion layers of a transfer transistor are formed. A gate electrode 54 is formed on a channel region between the pair of n-type diffusion layers 53.

A trench 55 for a trench capacitor is formed in contact with one of the pair of n-type diffusion layers 53. This trench 55 extends through the well region 52 such that the bottom portion reaches the substrate 51. On the inner circumferential surface in the lower portion of the trench 55, a thin insulating film 56 for a capacitor is formed. A thick insulating film 57 for isolation is formed in the upper portion of the trench 55. In addition, a conductive film 58 for storage is formed to fill the trench 55. Furthermore, a strap contact 59 for electrically connecting the storage conductive film 58 and one of the pair of n-type diffusion layers 53 is formed on the trench 55.

In this structure, the capacitor C of the memory cell MC is a trench capacitor composed of the n-type substrate 51, the storage conductive film 58, and the insulating film 56 as a dielectric film sandwiched between the n-type substrate 51 and the conductive film 58. However, a stack capacitor can also be used as this capacitor C.

In this fourth embodiment, the capacitances of the capacitors C in the memory cell arrays of the first and second DRAM circuits 13-1 and 13-2 are made different from each other. In this manner, DRAM circuits having different performances can be fabricated on the same semiconductor chip.

The capacitance of the capacitor C forming the memory cell can be changed by: changing the effective film thickness of the insulating film 56 of the capacitor; changing the effective area of the capacitor C; or changing the effective dielectric constant of the insulating film 56 of the capacitor C.

Generally, the capacitance of the capacitor C is increased by: decreasing the effective film thickness of the insulating film 56; increasing the effective area of the capacitor C; or increasing the effective dielectric constant of the insulating film 56 of the capacitor C.

Accordingly, in the memory cell array of the first DRAM circuit 13-1 in which a high-speed operation is given high priority, the capacitance of the capacitor C is decreased by: increasing the effective film thickness of the insulating film 56; decreasing the effective area of the capacitor C; or decreasing the effective dielectric constant of the insulating film 56 of the capacitor C.

On the other hand, in the memory cell array of the first DRAM circuit 13-2 in which a high-speed operation is given low priority, the capacitance of the capacitor C is increased by: decreasing the effective film thickness of the insulating film 56; increasing the effective area of the capacitor C; or increasing the effective dielectric constant of the insulating film 56 of the capacitor C, compared to the first DRAM circuit 13-1.

The effective film thicknesses of the insulating films 56 can be made different by separating the process of forming these insulating films 56.

When the trench capacitor as shown in FIG. 9 is used, the effective area of the capacitor C can be changed by changing the depth or diameter of the trench 55. When a stack capacitor is used, the height or diameter of this stack capacitor is so changed as to increase the area of the capacitor. The capacitor can also be changed by changing not only the two-dimensional pattern shape of the capacitor but also the three-dimensional shape by changing the fabrication steps.

Examples of the dielectric film with a high dielectric constant used as the insulating film 56 of the capacitor C are $Si_3N_4$, $Ta_2O_5$, and recently developed BST ($Ba_xSr_{1-x}TiO_3$). Assuming that the dielectric constant of $SiO_2$ is 1, the dielectric constants of $Si_3N_4$, $Ta_2O_5$, and BST are about 3, 10, and 300, respectively.

In the fourth embodiment as described above, the configurations of memory cell arrays used in DRAM circuits in one of which a high-speed operation is given high priority and in the other of which it is not are made different from each other by changing the capacitances of the capacitors in the memory cell arrays, thereby giving these memory cell arrays the respective suitable configurations. Consequently, DRAM circuits having different performances can be fabricated on the same semiconductor chip.

(Fifth Embodiment)

The fifth embodiment of the present invention will be described below.

In this fifth embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted.

Memory cells formed in memory cell arrays of the first and second DRAM circuits 13-1 and 13-2 are constructed in the same manner as shown in FIG. 3.

That is, a memory cell MC is composed of a transfer transistor TT and a capacitor C. As the transfer transistor TT, an n-channel MOS transistor is generally used.

When a memory cell is selected, a positive potential VPP generated by the word line driving potential generating circuit 29 shown in FIG. 2 is supplied to a word line WL connected to the gate electrode of the transfer transistor TT in the selected memory cell. Generally, this potential VPP is obtained by raising the power supply potential supplied to the semiconductor chip.

Figure 10:
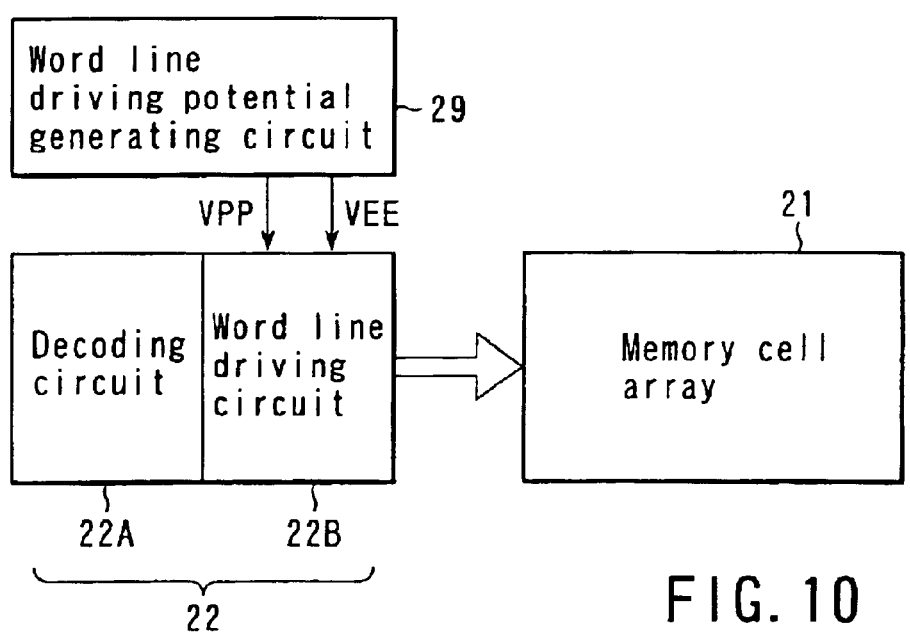
FIG. 10 is a block diagram showing a row-system control circuit formed in a memory embedded logic LSI according to the fifth embodiment of the present invention.

FIG. 10 shows a row-system control circuit of the circuit configuration shown in FIG. 2. A row decoder 22 includes a decoding circuit 22A for decoding an address, and a word line driving circuit 22B which selectively outputs the positive potential VPP generated by the word line driving potential generating circuit 29 to the word line WL in a memory cell array 21 on the basis of a decoding signal from the decoding circuit 22A.

The positive potential VPP output to the word line WL is supplied to the gate electrode of the transfer transistor TT shown in FIG. 3. When the transfer transistor TT is to be turned on, i.e., when the memory cell MC is to be selected, the ON current of the transfer transistor TT can be increased by raising the positive potential VPP output to the word line WL. As a consequence, the random access time can be shortened.

In this fifth embodiment, therefore, compared to the second DRAM circuit 13-2 requiring no high-speed operation, the positive potential VPP generated by the word line driving potential generating circuit 29 in the first DRAM circuit 13-1 requiring a high-speed operation is increased, thereby increasing the potential which, when the MOS transistor forming the memory cell in the first DRAM circuit 13-1 requiring a high-speed operation is to be turned on, is supplied to the gate electrode of the MOS transistor. This makes the value of the ON current in the first DRAM circuit 13-1 larger than that in the second DRAM circuit 13-2. However, the configurations of the MOS transistors constructing the memory cells in the first and second DRAM circuits 13-1 and 13-2 are the same.

That is, letting VPP1 denote the positive potential VPP generated by the word line driving potential generating circuit 29 in the first DRAM circuit 13-1, and VPP2 denote the positive potential VPP generated by the word line driving potential generating circuit 29 in the second DRAM circuit 13-2, these two word line driving potential generating circuits 29 are so configured that the relation VPP1>VPP2 holds.

Figure 11A:
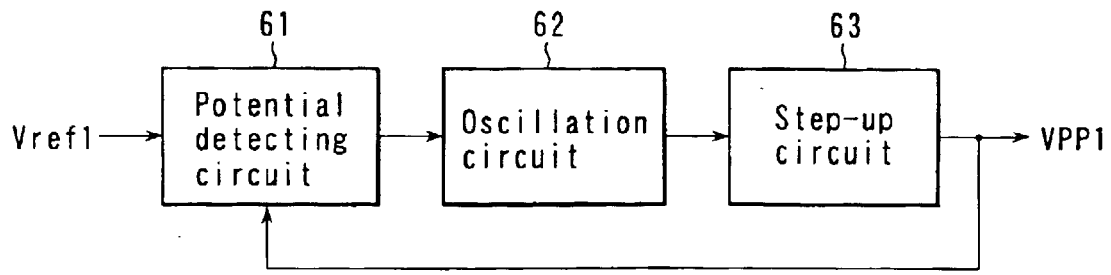
FIGS. 11A and 11B are block diagrams showing partial circuit configurations of two types of word line driving potential generating circuits in first and second DRAM circuits formed in the memory embedded logic LSI according to the fifth embodiment.
Figure 11B:
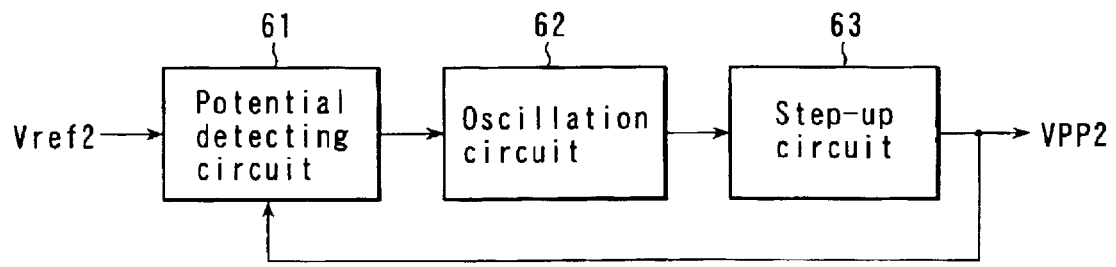

FIGS. 11A and 11B are block diagrams showing details of the arrangements of circuit portions for generating the positive potentials VPP in the word line driving potential generating circuits 29 of the first and second DRAM circuits 13-1 and 13-2, respectively.

The word line driving potential generating circuit 29 shown in FIG. 11A formed in the first DRAM circuit 13-1 comprises a potential detecting circuit 61, an oscillation circuit 62, and a charge pump type step-up circuit 63. The potential detecting circuit 61 compares the boosted potential VPP1 with a reference potential Vref1 and outputs a signal corresponding to the comparison result. The oscillation circuit 62 outputs a signal having a frequency corresponding to the output signal from the potential detecting circuit 61. The step-up circuit 63 receives the output signal from the oscillation circuit 62 and outputs the potential VPP1 by raising the power supply potential.

The word line driving potential generating circuit 29 shown in FIG. 11B formed in the second DRAM circuit 13-2 is the same as the word line driving potential generating circuit 29 in the first DRAM circuit 13-1 except that instead of the reference potential Vref1, a reference potential Vref2 lower than this reference potential Vref1 is input to the potential detecting circuit 61, so a detailed description thereof will be omitted.

The value of the boosted potential VPP output from the step-up circuit 63 can be changed by changing the value of the reference potential Vref input to the potential detecting circuit 61. When Vref1>Vref2, boosted potentials VPP1 and VPP2 meeting the relation VPP1>VPP2 can be generated.

In the word line driving potential generating circuits shown in FIGS. 11A and 11B, boosted potentials VPP having different values are output by changing the values of the reference potentials to be input to the potential detecting circuits 61. However, when the dividing ratios of the voltages fed back from the step-up circuits 63 to the potential detecting circuits 61 are made different from each other, boosted potentials VPP having different values can be output from the step-up circuits 63 by inputting reference potentials Vref having the same value to the potential detecting circuits 61. That is, voltage dividing circuits are inserted midway along the feedback paths of the boosted potentials VPP, and the voltage dividing ratios of these voltage dividing circuits are made different from each other.

In this fifth embodiment as described above, the configurations of the word line driving potential generating circuits for generating the positive potentials VPP to be supplied to the gate electrodes of the MOS transistors in the selected memory cells are made different from each other. Consequently, DRAM circuits having different performances can be fabricated on the same semiconductor chip.

Note that raising the driving potential of a selected word line is desirable to a high-speed operation, but an unnecessarily high potential is undesirable in respect of the power consumption and reliability. So, this driving potential is set at an appropriate value.

(Sixth Embodiment)

The sixth embodiment of the present invention will be described below.

In this sixth embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted.

Memory cells formed in memory cell arrays of the first and second DRAM circuits 13-1 and 13-2 are constructed in the same manner as shown in FIG. 3.

That is, a memory cell MC is composed of a transfer transistor TT and a capacitor C.

When a memory cell is not selected, a negative potential VEE generated by the word line driving potential generating circuit 29 shown in FIG. 2 is supplied to a word line WL connected to the gate electrode of the transfer transistor TT in this non-selected memory cell. Generally, this potential VEE is obtained by a charge pump type negative potential generating circuit.

When the transfer transistor TT which is an n-channel MOS transistor is turned off, i.e., when a memory cell is not selected, a leakage current of the OFF transistor can be decreased as the potential supplied to the word line is lowered. This OFF leakage current can be further decreased by supplying a negative potential to the word line.

In this sixth embodiment, therefore, the absolute value of the negative potential VEE generated by the word line driving potential generating circuit 29 of the second DRAM circuit 13-2 which requires no high-speed operation and gives preference to the data holding characteristic is made larger than that in the first DRAM circuit 13-1 requiring a high-speed operation.

With this configuration, the value of the breaking current of the MOS transistor forming a memory cell in the second DRAM circuit 13-2 becomes smaller than that in the first DRAM circuit 13-1.

That is, letting VEE1 denote the negative potential VEE generated by the word line driving potential generating circuit 29 in the first DRAM circuit 13-1, and VEE2 denote the negative potential VEE generated by the word line driving potential generating circuit 29 in the second DRAM circuit 13-2, these two word line driving potential generating circuits 29 are so configured that the relation |VEE1|<|VEE2| holds.

Figure 12A:
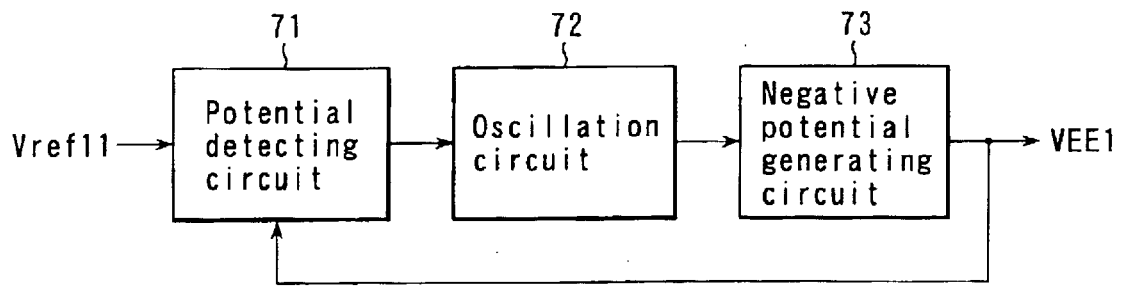
FIGS. 12A and 12B are block diagrams showing partial circuit configurations of two types of word line driving potential generation circuits in first and second DRAM circuits formed in a memory embedded logic LSI according to the sixth embodiment.
Figure 12B:
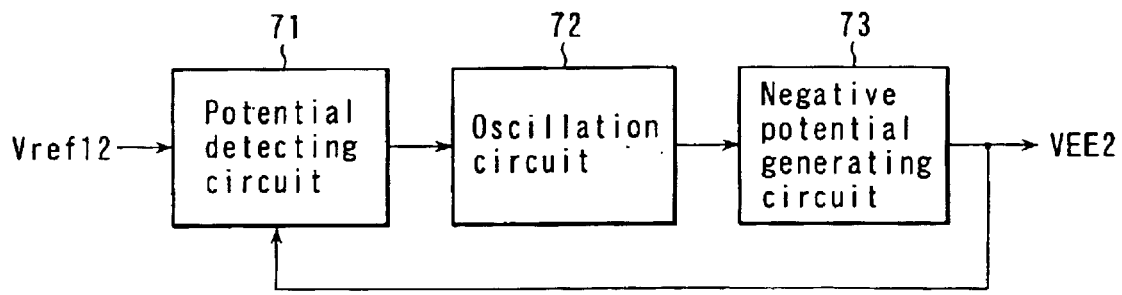

FIGS. 12A and 12B are block diagrams showing details of the arrangements of circuit portions for generating the negative potentials VEE in the word line driving potential generating circuits 29 of the first and second DRAM circuits 13-1 and 13-2, respectively.

The word line driving potential generating circuit 29 shown in FIG. 12A formed in the first DRAM circuit 13-1 includes a potential detecting circuit 71, an oscillation circuit 72, and a charge pump type negative potential generating circuit 73. The potential detecting circuit 71 compares the generated potential VEE1 with a reference potential Vref11 and outputs a signal corresponding to the comparison result. The oscillation circuit 72 outputs a signal having a frequency corresponding to the output signal from the potential detecting circuit 71. The negative potential generating circuit 73 receives the output signal from the oscillation circuit 72.

The word line driving potential generating circuit 29 formed in the second DRAM circuit 13-2 shown in FIG. 12B is the same as the word line driving potential generating circuit 29 in the first DRAM circuit 13-1 except that instead of the reference potential Vref11, a reference potential Vref12 lower than this reference potential Vref11 is input to the potential detecting circuit 71, so a detailed description thereof will be omitted.

The value of the negative potential VEE output from the negative potential generating circuit 73 can be changed by changing the value of the reference potential Vref input to the potential detecting circuit 71. Consequently, negative potentials VEE1 and VEE2 meeting the relation |VEE1|<|VEE2| can be generated.

As in the fifth embodiment, voltage dividing circuits can be inserted midway along the paths of the voltages fed back from the negative potential generating circuits 73 to the potential detecting circuits 71, thereby making the voltage dividing ratios of the circuits shown in FIGS. 12A and 12B different from each other. In this manner, negative potentials VEE having different values can be output from the negative potential generating circuits 73 by inputting reference potentials Vref having the same value to the potential detecting circuits 71.

In this sixth embodiment as described above, the value of the negative potential generated by the word line driving potential generating circuit and supplied to the gate electrode of the MOS transistor in a non-selected memory cell is changed. This makes different the configurations of the word line driving potential generating circuits in a DRAM circuit in which a high-speed operation is given low priority and in a DRAM circuit in which a high-speed operation is given high priority. Consequently, DRAM circuits having different performances can be fabricated on the same semiconductor chip.

In this embodiment, the word line driving potential generating circuits 29 in the second DRAM circuit 13-2 in which a high-speed operation is given low priority and in the first DRAM circuit 13-1 in which a high-speed operation is given high priority generate negative potentials, and the values of these negative potentials are made different from each other to change the values of the breaking currents of the transistors in memory cells. However, in the first DRAM circuit 13-1 which gives preference to a high-speed operation, the ground potential, instead of a negative potential, can be supplied to a word line driving circuit 22B shown in FIG. 9.

In this case, the potential detecting circuit 71, oscillation circuit 72, and negative potential generating circuit 73 for generating a negative potential need not be formed in the word line driving potential generating circuit 29 in the first DRAM circuit 13-1, so these circuits 71, 72, and 73 can be omitted.

(Seventh Embodiment)

The seventh embodiment of the present invention will be described below.

In this seventh embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted. Also, memory cells formed in memory cell arrays of the first and second DRAM circuits 13-1 and 13-2 are constructed in the same manner as shown in FIG. 3.

As shown in FIG. 3, a memory cell MC is composed of a transfer transistor TT which is an n-channel MOS transistor and a capacitor C. In each of the first and second DRAM circuits 13-1 and 13-2, a plurality of memory cells MC are formed in a plurality of p-type well regions set at the same potential.

In a DRAM circuit, to avoid deterioration of the data holding characteristic by a leakage current, a p-type well region in which a memory cell is formed is generally biased to a negative potential. If priority is given to raising the driving current of a transfer transistor forming the memory cell, it is desirable to decrease the absolute value of this negative bias. However, when the absolute value of the negative potential applied to the p-type well region is decreased, the breaking current of the transfer transistor increases. Accordingly, if a high-speed operation is given low priority, it is undesirable to decrease the absolute value of the negative potential applied to the p-type well region.

In this seventh embodiment, therefore, the absolute value of a negative well potential VWELL generated by the well potential generating circuit 30 in the first DRAM 13-1 requiring a high-speed operation is made smaller than that in the second DRAM circuit 13-2 in which a high-speed operation is given low priority, thereby increasing the ON current of the MOS transistor constructing the memory cell in the first DRAM circuit 13-1 requiring a high-speed operation.

Figure 13:
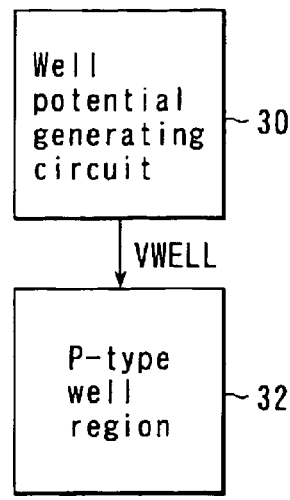
FIG. 13 is a block diagram showing a well potential generating circuit and a p-type well region formed in a memory embedded logic LSI according to the seventh embodiment of the present invention.

FIG. 13 shows the well potential generating circuit 30 shown in FIG. 2 and a p-type well region 32 of a memory cell array 21 to which the well potential VWELL generated by the well potential generating circuit 30 is supplied.

A plurality of p-type well regions 32 in the first and second DRAM circuits 13-1 and 13-2 are electrically connected in each DRAM circuit and electrically separated between these DRAM circuits. In each individual DRAM circuit, therefore, the well potential VWELL can be independently supplied to these p-type well regions 32.

In this configuration, the absolute value of the negative well potential VWELL generated by the well potential generating circuit 30 in the first DRAM circuit 13-1 requiring a high-speed operation is decreased, and the absolute value of the negative well potential VWELL generated by the well potential generating circuit 30 in the second DRAM circuit 13-2 in which a high-speed operation is given low priority is increased.

Figure 14A:
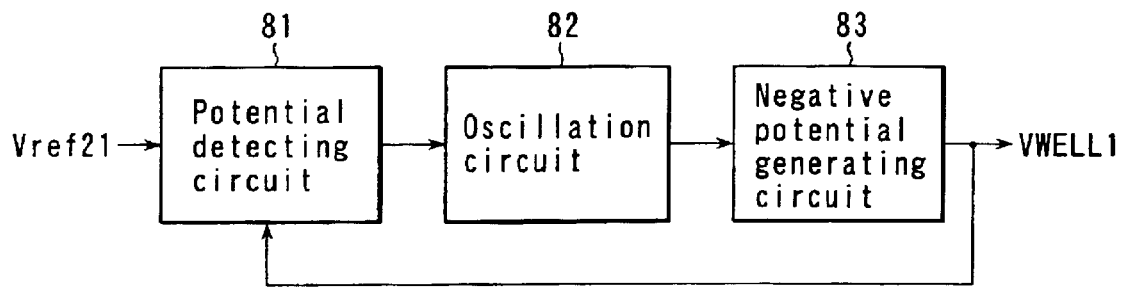
FIGS. 14A and 14B are block diagrams showing the arrangements of two types of well potential generating circuits in first and second DRAM circuits formed in the memory embedded logic LSI according to the seventh embodiment.
Figure 14B:
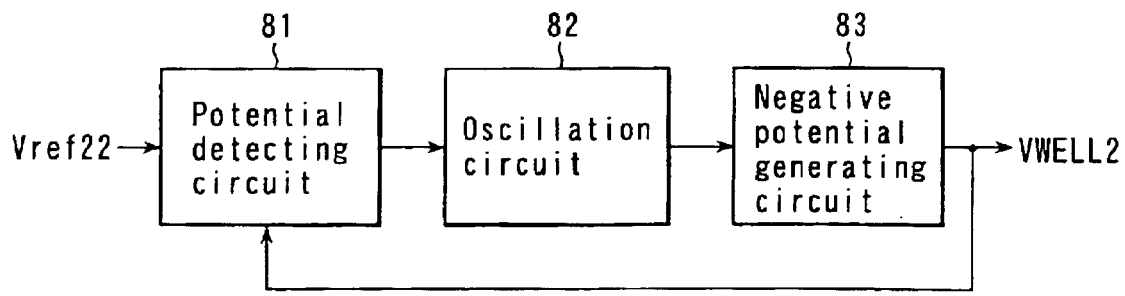

FIGS. 14A and 14B are block diagrams showing details of the arrangements of the well potential generating circuits 30 in the first and second DRAM circuits 13-1 and 13-2, respectively.

The well potential generating circuit 30 shown in FIG. 14A formed in the first DRAM circuit 13-1 includes a potential detecting circuit 81, an oscillation circuit 82, and a charge pump type negative potential generating circuit 83. The potential detecting circuit 81 compares a generated potential VWELL1 with a reference potential Vref21 and outputs a signal corresponding to the comparison result. The oscillation circuit 82 outputs a signal having a frequency corresponding to the output signal from the potential detecting circuit 81. The negative potential generating circuit 83 receives the output signal from the oscillation circuit 82.

The well potential generating circuit 30 shown in FIG. 14B formed in the second DRAM circuit 13-2 is the same as the well potential generating circuit 30 in the first DRAM circuit 13-1 except that a reference potential Vref22 having a value different from the reference potential Vref21 is input to the potential detecting circuit 81, so a detailed description thereof will be omitted.

The value of the negative potential VWELL output from the negative potential generating circuit 83 can be changed by changing the value of the reference potential Vref input to the potential detecting circuit 81. Consequently, negative potentials VWELL1 and VWELL2 meeting the relation |VWELL1|<|VWELL2| can be generated.

As in the above embodiments, voltage dividing circuits can be inserted midway along the paths of the negative potentials VWELL fed back from the negative potential generating circuits 83 to the potential detecting circuits 81, thereby making the voltage dividing ratios of the circuits shown in FIGS. 14A and 14B different from each other. In this manner, negative potentials VWELL having different values can be output from the negative potential generating circuits 83 by inputting reference potentials Vref having the same value to the potential detecting circuits 81.

In this seventh embodiment as described above, the value of the negative potential generated by the well potential generating circuit and supplied to the well region of the memory cell array is changed. This makes different the configurations of the well potential generating circuits in a DRAM circuit in which a high-speed operation is given low priority and in a DRAM circuit in which a high-speed operation is given high priority. Consequently, DRAM circuits having different performances can be fabricated on the same semiconductor chip.

(Eighth Embodiment)

The eighth embodiment of the present invention will be described below.

In this eighth embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted. Also, memory cells formed in memory cell arrays of the first and second DRAM circuits 13-1 and 13-2 are constructed in the same manner as shown in FIG. 3.

As shown in FIG. 3, a memory cell in each DRAM circuit is composed of a transfer transistor TT and a capacitor C. The drain diffusion layer of the transfer transistor TT is connected to a bit line BL.

The potential amplitude of this bit line BL is closely related to a signal amount stored in a memory cell and to the operation of a sense amplifier for amplifying the signal of a memory cell. For example, in a DRAM circuit requiring high-speed data read and write to a memory cell, the High level (high potential) of the bit line BL is raised; in a DRAM circuit in which high-speed read and write are given low priority, the High level (high potential) of the bit line BL is lowered.

In this eighth embodiment, therefore, the value of a positive potential VBL generated by the bit line driving potential generating circuit 31 in the first DRAM circuit 13-1 requiring a high-speed operation is increased, thereby raising the High level of the bit line BL in this first DRAM circuit 13-1.

On the other hand, unnecessarily raising the High level of the bit line in the second DRAM circuit 13-2 in which high-speed read and write are given low priority is undesirable because the current consumption increases. Accordingly, the value of a positive potential VBL generated by a bit line driving potential generating circuit 31 in this second DRAM circuit 13-2 is decreased.

Figure 15:
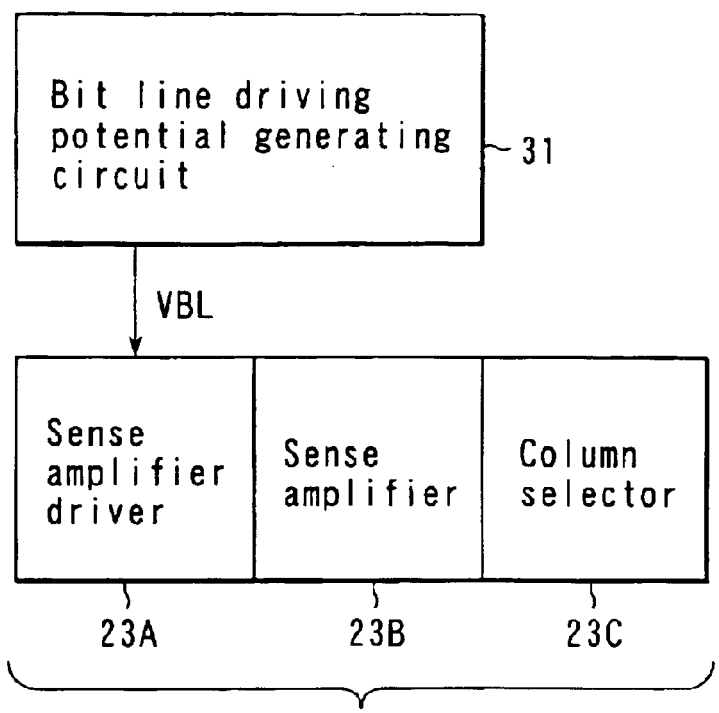
FIG. 15 is a block diagram showing a bit line driving potential generating circuit and a sense amplifier & column selector circuit formed in a memory embedded logic LSI according to the eighth embodiment of the present invention.

FIG. 15 shows the bit line driving potential generating circuit 31 and a sense amplifier (S/A) & column selector circuit 23 to which the bit line driving potential VBL generated by this circuit 31 is supplied, both extracted from the circuit shown in FIG. 2.

The sense amplifier (S/A) & column selector circuit 23 includes a sense amplifier driver 23A, a sense amplifier 23B, and a column selector 23C. The sense amplifier driver 23A receives the bit line driving potential VBL generated by the bit line driving potential generating circuit 31. The sense amplifier 23B receives, as operating potentials, the potential VBL and the ground potential output from the sense amplifier driver 23A. The column selector 23C selects a column.

Figure 16A:
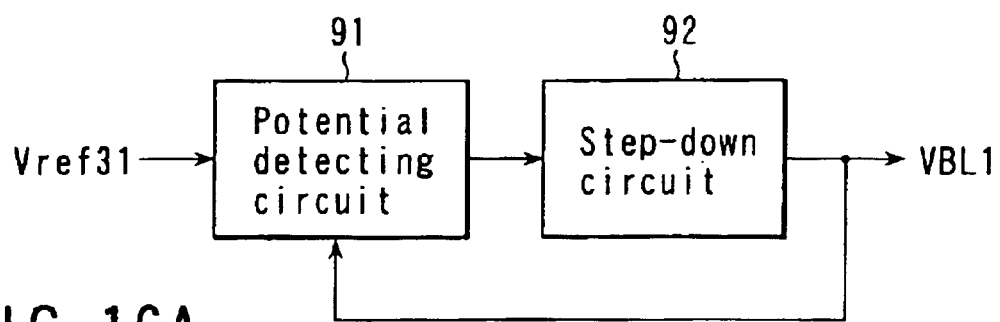
FIGS. 16A and 16B are block diagrams showing the arrangements of two types of bit line driving potential generating circuits in first and second DRAM circuits formed in the memory embedded logic LSI according to the eighth embodiment.
Figure 16B:
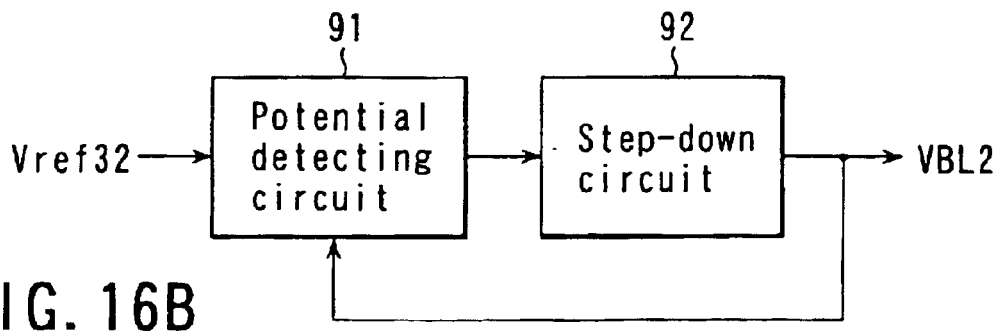

FIGS. 16A and 16B are block diagrams showing details of the arrangements of the bit line driving potential generating circuits 31 in the first and second DRAM circuits 13-1 and 13-2, respectively.

The bit line driving potential generating circuit 31 shown in FIG. 16A formed in the first DRAM circuit 13-1 includes a potential detecting circuit 91 and a step-down circuit 92. The potential detecting circuit 91 compares the generated potential VBL with a reference potential Vref31 and outputs a signal corresponding to the comparison result. The step-down circuit 92 lowers the power supply potential in accordance with the output signal from the potential detecting circuit 91, and outputs the potential VBL.

The bit line driving potential generating circuit 31 shown in FIG. 16B formed in the second DRAM circuit 13-2 is the same as the bit line driving potential generating circuit 31 in the first DRAM circuit 13-1 except that a reference potential Vref32 having a value different from the reference potential Vref31 is input to the potential detecting circuit 91, so a detailed description thereof will be omitted.

The value of the potential VBL output from the step-down circuit 92 can be changed by changing the value of the reference potential Vref input to the potential detecting circuit 91. Consequently, bit line driving potentials VBL1 and VBL2 meeting the relation VBL1>VBL2 can be generated.

As in the above embodiments, voltage dividing circuits can be inserted midway along the paths of the bit line driving potentials VBL fed back from the step-down circuits 92 to the potential detecting circuits 91, thereby making the voltage dividing ratios of the circuits shown in FIGS. 16A and 16B different from each other. In this manner, potentials VBL having different values can be output from the step-down circuits 92 by inputting reference potentials Vref having the same value to the potential detecting circuits 91.

In this eighth embodiment as described above, the value of the potential VBL generated by the bit line driving potential generating circuit and supplied to the bit line is changed. This makes different the configurations of the well potential generating circuits in a DRAM circuit in which a high-speed operation is given low priority and in a DRAM circuit in which a high-speed operation is given high priority. Consequently, DRAM circuits having different performances can be fabricated on the same semiconductor chip.

(Ninth Embodiment)

The ninth embodiment of the present invention will be described below.

In this ninth embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted. Also, each memory cell formed in memory cell arrays of the first and second DRAM circuits 13-1 and 13-2 is composed of a transfer transistor TT and a capacitor C in the same manner as shown in FIG. 3.

In a general-purpose DRAM used as a single device, a self-aligned contact is generally used as a bit line contact connecting a drain diffusion layer of a memory cell and a bit line. This self-aligned contact is formed by forming an oxide film on a gate electrode, and forming a contact hole in a dielectric interlayer by using the oxide film as a mask for contact formation.

A transistor having this self-aligned contact structure is commonly used in a general-purpose DRAM but is not used in a logic circuit. That is, in a logic LSI a transistor having a salicide structure is generally used to improve the transistor performance.

The salicide structure transistor is desirable when high speed is necessary, since the resistance of a gate electrode can be very lowered.

Unfortunately, the fabrication process of the salicide structure transistor conflicts with that of the self-aligned contact structure transistor. Therefore, the self-aligned contact structure transistor and the salicide structure transistor are conventionally not used in a memory cell of a DRAM circuit at the same time.

Accordingly, when the self-aligned contact is chosen as a bit line contact of a memory cell in a DRAM circuit, the salicide structure transistor cannot be used in this memory cell; when the salicide structure transistor is used in a memory cell of a DRAM circuit, the self-aligned contact cannot be used.

In the latter case, although the resistance of a gate electrode increases, it is no longer necessary to take mask misalignment into consideration because a self-aligned contact can be used. As a consequence, the size of a memory cell can be made smaller than that in the former case.

In this ninth embodiment, therefore, a transistor having a salicide structure capable of achieving high speed by lowering the resistance of a gate electrode is used as the transistor in the memory cell of the first DRAM circuit 13-1 requiring a high-speed operation. In the second DRAM circuit 13-2 in which a high-speed operation is given low priority, a transistor having a self-aligned contact is used as the transistor in the memory cell.

Figure 17A:
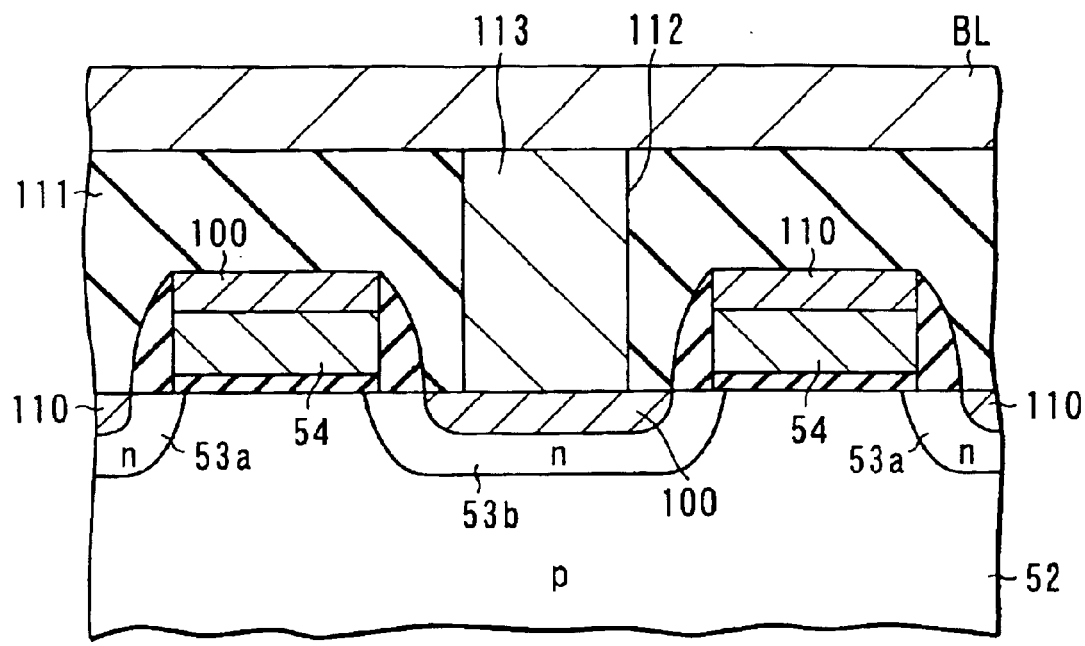
FIGS. 17A and 17B are sectional views of two types of transistors used as transfer transistors in first and second DRAM circuits formed in a memory embedded logic LSI according to the ninth embodiment of the present invention.

FIG. 17A shows the sectional structure of a transistor used as the transfer transistor in the memory cell of the first DRAM circuit 13-1. On the surface of a p-type well region (p-well) 52, a pair of n-type diffusion layers 53a as source diffusion layers of a pair of transfer transistors and an n-type diffusion layer 53b as a common drain diffusion layer of the pair of transfer transistors are formed. A metal silicide layer 110 is formed by doping a high-melting-point metal into the surface regions of the pair of n-type diffusion layers 53a and the n-type diffusion layer 53b. On a channel region between one of the pair of n-type diffusion layers 53a and the n-type diffusion layer 53b and on a channel region between the other one of the pair of n-type diffusion layers 53a and the n-type diffusion layer 53b, gate electrodes 54 consisting of a gate insulating film and a polysilicon layer are formed. A metal silicide layer 110 is also formed by doping a high-melting-point metal into the upper portion of the polysilicon layer of each gate electrode 54.

A dielectric interlayer 111 is formed on the entire surface, and a contact hole 112 extending to the n-type diffusion layer 53b is formed in this dielectric interlayer 111 by using a mask for contact formation. A bit line contact 113 is formed by filling the contact hole 112 with a conductive film. The bit line contact 113 is electrically connected to a bit line BL formed on the dielectric interlayer 111.

A transistor in which the metal silicide layer is formed on the source and drain diffusion layers and on the gate electrode as described above is called a salicide structure transistor. This transistor can achieve high speed because the resistance of the gate electrode can be very lowered.

Figure 17B:
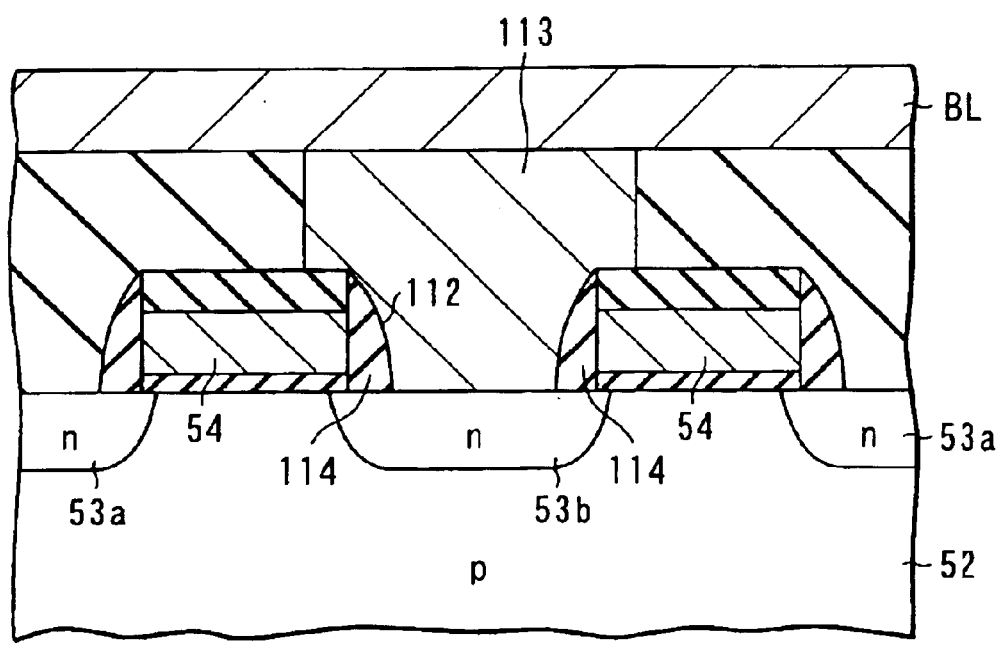

FIG. 17B shows the sectional structure of a transistor used as the transfer transistor in the memory cell of the second DRAM circuit 13-2. The same reference numerals as in FIG. 17A denote the same parts in FIG. 17B, and a detailed description thereof will be omitted. Only differences from FIG. 17A will be explained below.

In this structure, no such metal silicide layer 110 as shown in FIG. 17A is formed on the surface regions of a pair of n-type diffusion layers 53a and an n-type diffusion layer 53b and in the upper portion of a polysilicon layer of each gate electrode 54.

A side-wall insulating film 114 is formed on the side walls of each gate electrode 54. Additionally, in a dielectric interlayer 111 formed on the entire surface, a contact hole 112 extending to the n-type diffusion layer 53b is formed in self-alignment by using the side-wall insulating film 114 as a mask. A bit line contact 113 is formed by filling the contact hole 112 with a conductive film.

In a transistor in which a self-aligned contact (bit line contact 113) is formed with respect to the common drain diffusion layer 53b as described above, misalignment when the contact is formed with respect to the common drain diffusion layer 53b need not be taken into account. This makes the transistor size smaller than that shown in FIG. 17A, and increases the degree of integration rather than the operating speed.

In this ninth embodiment as described above, a transistor having a self-aligned contact structure is used in one DRAM circuit, and a transistor having no such self-aligned contact structure is used in the other DRAM circuit. Alternatively, a transistor in which a gate electrode has a salicide structure is used in one DRAM circuit, and a transistor having no such salicide structure is used in the other DRAM circuit. This makes different the configurations of the transistors in a DRAM in which a high-speed operation is given low priority and in a DRAM in which a high-speed operation is given high priority. Consequently, DRAM circuits having different performances can be fabricated on the same semiconductor chip.

(10th Embodiment)

The 10th embodiment of the present invention will be described below.

In this 10th embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted. Also, each memory cell formed in memory cell arrays of the first and second DRAM circuits 13-1 and 13-2 is composed of a transfer transistor TT and a capacitor C in the same manner as shown in FIG. 3.

Generally, in a memory cell array of a DRAM circuit, a large number of memory cells are connected to a bit line and a large number of memory cells are connected to a word line. When a high-speed operation must have preference, it is desirable to reduce the total number of memory cells connected to one bit line or reduce the total number of memory cells connected to one word line.

When the number of memory cells per bit line is reduced, the parasitic capacitance of each bit line can be decreased. This is effective to achieve a high-speed operation because the charge/discharge time of each bit line can be shortened. Likewise, when the number of memory cells per word line is reduced, the parasitic capacitance of each word line can be decreased. This is effective to achieve a high-speed operation because charge/discharge of each word line can be rapidly performed.

However, reducing the total number of memory cells per bit line or word line is equivalent to dividing a memory cell array into a plurality of fine memory blocks. Accordingly, the area occupied by a sense amplifier and a row decoder increases.

As described above, therefore, reducing the total number of memory cells per bit line or word line is desirable for a high-speed operation, but the area of a DRAM circuit increases. If the number of divided blocks of a memory cell array of a DRAM circuit in which a high-speed operation is given low priority is similarly increased, an increase in the area is no longer allowable.

In this 10th embodiment, therefore, the total number of memory cells connected to one word line in a memory cell array of the first DRAM circuit 13-1 requiring a high-speed operation is made smaller than that in a memory cell of the second DRAM circuit 13-2 in which a high-speed operation is given low priority, thereby rapidly charging/discharging word lines. In this way, the speed of a word line selecting operation is increased.

Figure 18A:
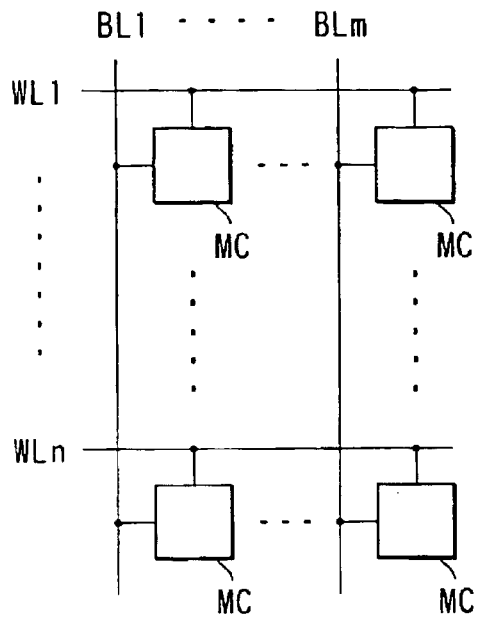
FIGS. 18A and 18B are circuit diagrams of two types of memory cell arrays in first and second DRAM circuits formed in a memory embedded logic LSI according to the 10th embodiment of the present invention.
Figure 18B:
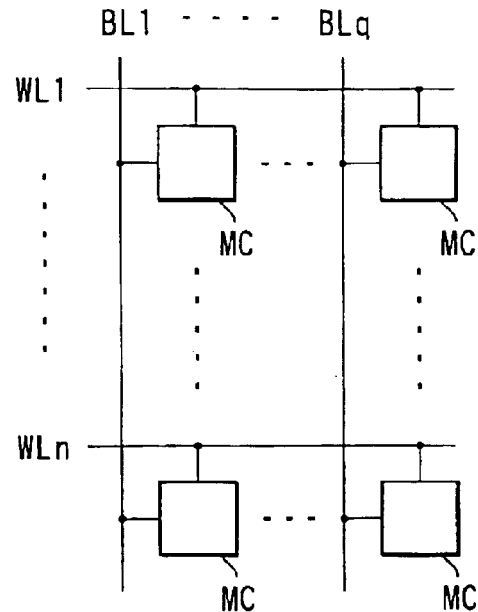

FIGS. 18A and 18B are circuit diagrams showing details of the arrangements of individual memory blocks in memory cell arrays 21 of the first and second DRAM circuits 13-1 and 13-2, respectively.

In the memory block shown in FIG. 18A in the first DRAM circuit 13-1, a plurality of word lines WL1 to WLn and a plurality of bit lines BL1 to BLm run to cross each other. A memory cell MC is connected to each intersection of these word line and bit line.

Analogously, in the memory block shown in FIG. 18B in the second DRAM circuit 13-2, a plurality of word lines WL1 to WLn and a plurality of bit lines BL1 to BLq run to cross each other. A memory cell MC is connected to each intersection of these word line and bit line.

The number m of the bit lines in the memory block of the first DRAM circuit 13-1 is made smaller than the number q of the bit lines in the memory block of the second DRAM circuit 13-2. That is, the total number m of the memory cells MC connected to each word line WL in the memory block of the first DRAM circuit 13-1 is smaller than the total number q of the memory cells MC connected to each word line WL in the memory block of the second DRAM circuit 13-2.

In this 10th embodiment as described above, the total numbers of memory cells connected to the individual word lines in the memory cell arrays of the first and second DRAM circuits 13-1 and 13-2 are made different from each other. This makes different the configurations of the memory cell arrays in a DRAM in which a high-speed operation is given low priority and in a DRAM in which a high-speed operation is given high priority. Consequently, DRAM circuits having different performances can be fabricated on the same semiconductor chip.

(11th Embodiment)

The 11th embodiment of the present invention will be described below.

In the above 10th embodiment, the total numbers of memory cells connected to word lines in memory cell arrays of first and second DRAM circuits are made different from each other, thereby making different the configurations of the memory cell arrays in a DRAM in which a high-speed operation is given low priority and in a DRAM in which a high-speed operation is given high priority. In this 11th embodiment, the total numbers of memory cells connected to individual bit lines in memory cell arrays of first and second DRAM circuits are made different from each other, thereby making the bit line charge/discharge times in the first and second DRAM circuits different from each other.

Figure 19A:
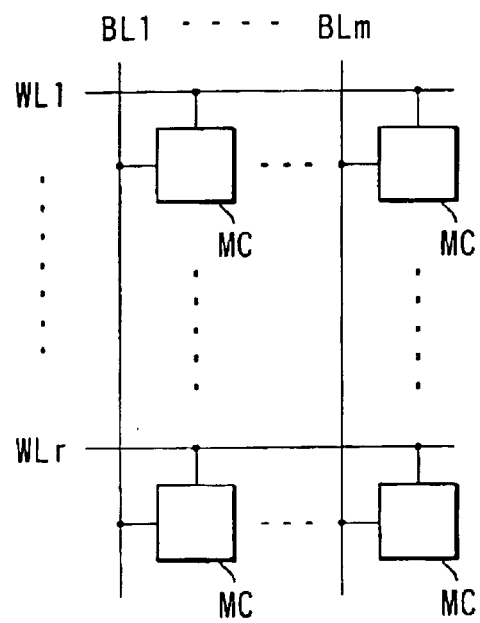
FIGS. 19A and 19B are circuit diagrams of two types of memory cell arrays in first and second DRAM circuits formed in a memory embedded logic LSI according to the 11th embodiment of the present invention.
Figure 19B:
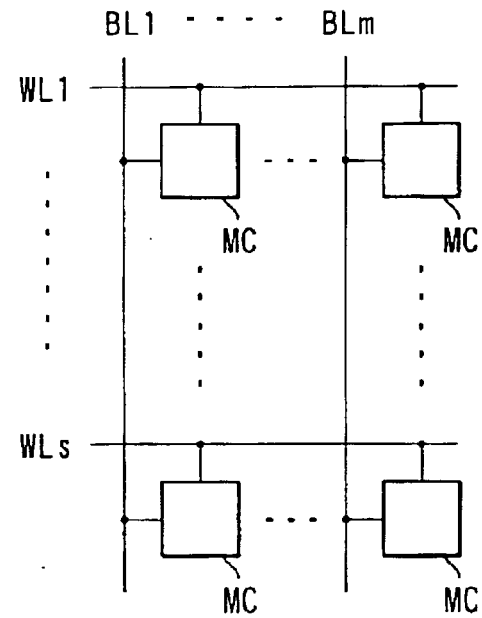

FIGS. 19A and 19B are circuit diagrams showing details of the arrangements of individual memory blocks in memory cell arrays 21 of first and second DRAM circuits 13-1 and 13-2, respectively.

In the memory block shown in FIG. 19A in the first DRAM circuit 13-1, a plurality of word lines WL1 to WLr and a plurality of bit lines BL1 to BLm run to cross each other. A memory cell MC is connected to each intersection of these word line and bit line.

Analogously, in the memory block shown in FIG. 19B in the second DRAM circuit 13-2, a plurality of word lines WL1 to WLs and a plurality of bit lines BL1 to BLm run to cross each other. A memory cell MC is connected to each intersection of these word line and bit line.

The number r of the word lines in the memory block of the first DRAM circuit 13-1 is made smaller than the number s of the word lines in the memory block of the second DRAM circuit 13-2. That is, the total number r of the memory cells MC connected to each bit line BL in the memory block of the first DRAM circuit 13-1 is smaller than the total number s of the memory cells MC connected to each bit line BL in the memory block of the second DRAM circuit 13-2.

In this 11th embodiment as described above, the total numbers of memory cells connected to the individual bit lines in the memory cell arrays of the first and second DRAM circuits 13-1 and 13-2 are made different from each other. This makes different the configurations of the memory cell arrays in a DRAM in which a high-speed operation is given low priority and in a DRAM in which a high-speed operation is given high priority. Consequently, DRAM circuits having different performances can be fabricated on the same semiconductor chip.

(12th Embodiment)

The 12th embodiment of the present invention will be described below.

In this 12th embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted. Also, each memory cell formed in memory cell arrays of the first and second DRAM circuits 13-1 and 13-2 is composed of a transfer transistor TT and a capacitor C in the same manner as shown in FIG. 3.

In a DRAM circuit, the influence of interference noise caused by the capacitive coupling between two adjacent bit lines cannot be ignored in a memory cell array. Therefore, a method is known by which the influence of interference noise is reduced by using a so-called bit line twisting method which forms a twisted bit line pair.

In this bit line twisting method, the influence of interference noise between bit lines can be reduced. Accordingly, data read out from a memory cell can be sensed by a sense amplifier immediately after the bit line potential slightly changes. That is, since the sense amplifier can be operated at an earlier timing, the method is desirable to increase the operating speed. However, crossing and twisting a pair of bit lines require an extra area. Hence, whether to twist bit lines is preferably selected in accordance with the required performance.

In this 12th embodiment, therefore, bit lines having a twisted bit line structure are used in the memory cell array of the first DRAM 13-1 requiring a high-speed operation, and bit lines having no such twisted bit line structure are used in the memory cell array of the second DRAM circuit 13-2 in which a high-speed operation is given low priority. The operating speed is increased by operating a sense amplifier at earlier timings in the first DRAM circuit 13-1 requiring a high-speed operation.

Figure 20A:
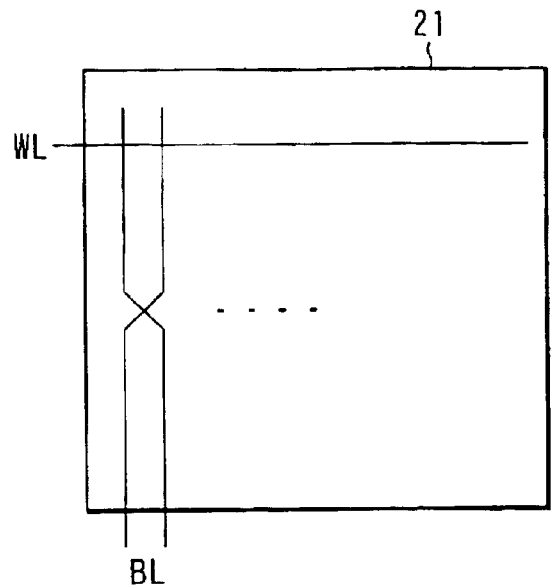
FIGS. 20A and 20B are circuit diagrams of two types of memory cell arrays in first and second DRAM circuits formed in a memory embedded logic LSI according to the 12th embodiment of the present invention.
Figure 20B:
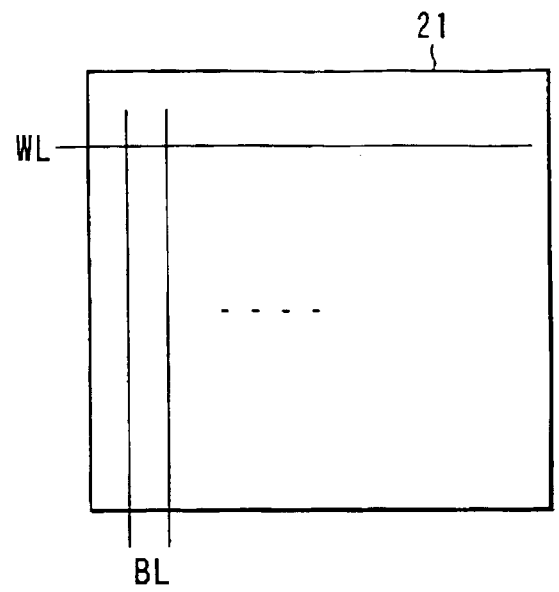

FIGS. 20A and 20B are circuit diagrams schematically showing the arrangements of memory cell arrays 21 in the first and second DRAM circuits 13-1 and 13-2, respectively, according to the 12th embodiment.

The memory cell array 21 shown in FIG. 20A in the first DRAM circuit 13-1 has a twisted bit line structure in which each pair of adjacent ones of a plurality of bit lines BL cross each other midway along the lines.

The memory cell array 21 shown in FIG. 20B in the second DRAM circuit 13-2 has no such twisted bit line structure, i.e., a plurality of bit lines BL run parallel to each other without crossing each other.

In this 12th embodiment as described above, the twisted bit line structure is selectively used in the memory cell arrays of the first and second DRAM circuits. This makes different the configurations of the memory cell arrays in a DRAM in which a high-speed operation is given low priority and in a DRAM in which a high-speed operation is given high priority. Consequently, DRAM circuits having different performances can be fabricated on the same semiconductor chip.

Figure 21A:
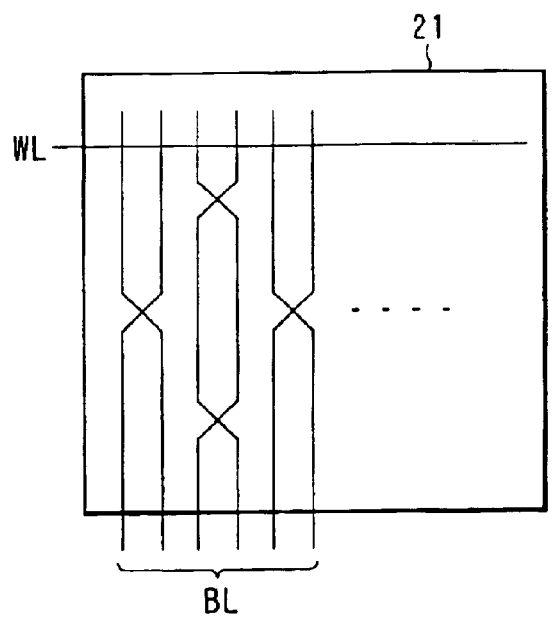
FIGS. 21A and 21B are circuit diagrams of two types of memory cell arrays formed in a memory embedded logic LSI according to a modification of the 12th embodiment.
Figure 21B:
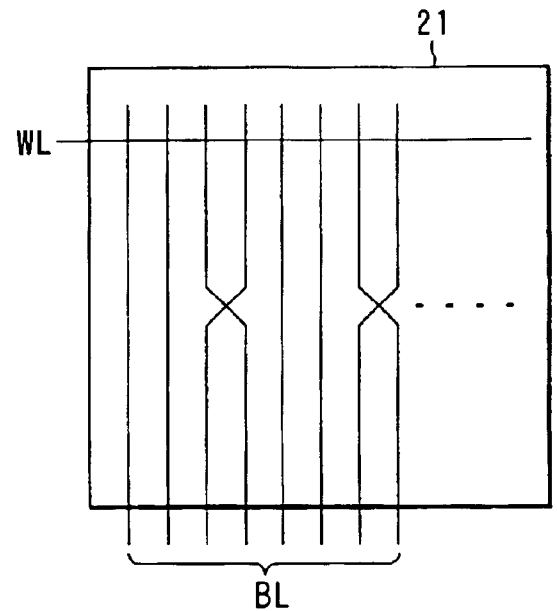

As a modification of the above 12th embodiment, as shown in FIGS. 21A and 21B, the twisted bit line structure can also be used in the memory cell arrays 21 in both the first and second DRAM circuits. In this case, the ways of bit line twisting are made different from each other.

That is, in the memory cell array shown in FIG. 21A, the twisted bit line structure is used for all bit line pairs. In the memory cell array 21 shown in FIG. 21B, the twisted bit line structure is used for every other bit line pair.

(13th Embodiment)

The 13th embodiment of the present invention will be described below.

In this 13th embodiment, an outline of the arrangement of a DRAM embedded logic LSI is the same as FIG. 1, and the internal arrangement of first and second DRAM circuits 13-1 and 13-2 in FIG. 1 is also the same as FIG. 2. Therefore, a detailed description of these arrangements will be omitted. Also, each memory cell formed in memory cell arrays of the first and second DRAM circuits 13-1 and 13-2 is composed of a transfer transistor TT and a capacitor C in the same manner as shown in FIG. 3.

As explained in FIG. 2, a DRAM circuit contains the refresh control circuit including the refresh timer 27 and the refresh address counter 28, in order to refresh stored data in a memory cell in the memory cell array 21 at a predetermined period.

The refresh timer 27 automatically generates a timer signal having a predetermined period. The refresh address counter 28 counts the timer signal to generate a row address for refreshing the memory cell array 21.

With this configuration, a plurality of word lines in the memory cell array 21 are sequentially selected to perform a refresh operation, regardless of an externally supplied address.

In a DRAM circuit in which a high-speed operation is given high priority, a high-speed operation is preferably performed even at the expense of the data holding characteristic of a memory cell. In this case, however, a refresh operation must be frequently performed. Accordingly, in a DRAM circuit in which a high-speed operation is given high priority, the period of the timer signal automatically generated by the refresh timer 27 is shortened in accordance with the data holding characteristic of the circuit.

In this 13th embodiment, therefore, the period of the timer signal generated by the refresh timer 27 in the first DRAM circuit 13-1 requiring a high-speed operation is made different from the period of the timer signal generated by the refresh timer 27 in the second DRAM circuit 13-2 in which a high-speed operation is given low priority. In this manner, the period of a refresh operation in the memory cell array 21 of the first DRAM circuit 13-1 is made shorter than that of a refresh operation in the memory cell array 21 of the second DRAM circuit 13-2.

With this arrangement, a refresh operation is performed at high speed in the first DRAM circuit 13-1 requiring a high-speed operation.

That is, in this 13th embodiment, the periods of the refresh timers in the first and second DRAM circuits are made different from each other, thereby making the configuration of a DRAM circuit in which a high-speed operation is given high priority different from that of a DRAM circuit in which a high-speed operation is given low priority. Consequently, DRAM circuits having different performances can be fabricated on the same semiconductor chip.

(14th Embodiment)

The 14th embodiment of the present invention will be described below. In each of the first to 13th embodiments described above, one of the first and second DRAM circuits gives preference to a high-speed operation, and these DRAM circuits are so configured as to meet this demand. Therefore, the random access time can be shortened by shortening the intervals between operation timings by control signals in a DRAM circuit in which a high-speed operation has preference.

On the other hand, in a DRAM circuit in which a high-speed operation is given low priority, the intervals between the operation timings by control signals are made longer than in the DRAM circuit in which a high-speed operation is given high priority. This prolongs the random access time.

The present invention is not limited to the above embodiments and can be modified when practiced without departing from the scope of the invention.

Although some of the embodiments increase the fabrication cost, the application of each embodiment can achieve improvements in the performance which cannot be conventionally realized. Therefore, the present invention is very effective in applications in which the new values produced by these improvements are large. In particular, integrating a large-scale system into one chip presumably advances more than in the conventional devices. This makes the present invention effective in memory embedded LSIs in the future.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a first memory circuit configured to have a first memory cell array having a plurality of memory cells each including a first MOS transistor, and have a first potential generating circuit which generates at least one potential used to operate said plurality of memory cells in said first memory cell array, said first memory circuit being formed in a semiconductor chip; and
   at least one second memory circuit configured to have a second memory cell array having a plurality of memory cells each including a second MOS transistor different in characteristic from said first MOS transistor, and have a second potential generating circuit which generates at least one potential used to operate said plurality of memory cells in said second memory cell array, said at least one second memory circuit being formed in the same semiconductor chip as said first memory circuit.

2. A circuit according to claim 1, further comprising a logic circuit configured to connect to said first and second memory circuits to exchange data with said first and second memory circuits.

3. A circuit according to claim 1, wherein each of said first and second memory circuits is one of a DRAM circuit, an SRAM circuit, a nonvolatile memory such as a flash memory, a ferroelectric memory circuit, and a magnetic memory circuit.

4. A circuit according to claim 1, wherein the values of ON currents of said first and second MOS transistors are made different from each other, thereby making the characteristics of said first and second MOS transistors different from each other.

5. A circuit according to claim 4, wherein the channel lengths of said first and second MOS transistors are made different from each other, thereby making the values of ON currents of said first and second MOS transistors different from each other.

6. A circuit according to claim 4, wherein the channel widths of said first and second MOS transistors are made different from each other, thereby making the values of ON currents of said first and second MOS transistors different from each other.

7. A circuit according to claim 4, wherein each of said first and second MOS transistors is an insulated gate transistor having a gate insulating film, and the values of ON currents of said first and second MOS transistors are made different from each other by making the film thicknesses of said gate insulating films different from each other.

8. A circuit according to claim 4, wherein each of said first and second MOS transistors is an insulated gate transistor having a predetermined threshold voltage, and the values of ON currents of said first and second MOS transistors are made different from each other by making the threshold voltages different from each other.

9. A circuit according to claim 8, wherein each of said first and second MOS transistors has a channel region, and the threshold voltages of said first and second MOS transistors are made different from each other by making the concentrations of impurities contained in said channel regions different from each other.

10. A circuit according to claim 1, wherein the values of breaking currents of said first and second MOS transistors are made different from each other, thereby making the characteristics of said first and second MOS transistors different from each other.

11. A circuit according to claim 10, wherein the channel lengths of said first and second MOS transistors are made different from each other, thereby making the values of ON currents of said first and second MOS transistors different from each other.

12. A circuit according to claim 10, wherein the channel widths of said first and second MOS transistors are made different from each other, thereby making the values of ON currents of said first and second MOS transistors different from each other.

13. A circuit according to claim 10, wherein each of said first and second MOS transistors is an insulated gate transistor having a gate insulating film, and the values of ON currents of said first and second MOS transistors are made different from each other by making the film thicknesses of said gate insulating films different from each other.

14. A circuit according to claim 10, wherein each of said first and second MOS transistors is an insulated gate transistor having a predetermined threshold voltage, and the values of ON currents of said first and second MOS transistors are made different from each other by making the threshold voltages different from each other.

15. A circuit according to claim 14, wherein each of said first and second MOS transistors has a channel region, and the threshold voltages of said first and second MOS transistors are made different from each other by making the concentrations of impurities contained in said channel regions different from each other.

16. A semiconductor integrated circuit comprising:
    a first memory circuit configured to have a first memory cell array having a plurality of memory cells each including a first MOS transistor and a first capacitor, and in which said plurality of memory cells are connected to a first bit line, and have a first potential generating circuit which generates at least one potential used to operate said plurality of memory cells in said first memory cell array, said first memory circuit being formed in a semiconductor chip; and
    at least one second memory circuit configured to have a second memory cell array having a plurality of memory cells each including a second MOS transistor and a second capacitor, said plurality of memory cells are connected to a second bit line, and the value of a resistance present on a path between said second capacitor and said second bit line is made different from the value of a resistance present on a path between said first capacitor and said first bit line in said first memory cell array, and have a second potential generating circuit which generates at least one potential used to operate said plurality of memory cells in said second memory cell array, said at least one second memory circuit being formed in the same semiconductor chip as said first memory circuit.

17. A circuit according to claim 16, further comprising a logic circuit configured to connect to said first and second memory circuits to exchange data with said first and second memory circuits.

18. A circuit according to claim 16, wherein each of said first and second memory circuits is one of a DRAM circuit, an SRAM circuit, a nonvolatile memory such as a flash memory, a ferroelectric memory circuit, and a magnetic memory circuit.

19. A circuit according to claim 16, wherein
each of said plurality of memory cells in said first memory cell array is connected to said first bit line by a first bit line contact,
each of said plurality of memory cells in said second memory cell array is connected to said second bit line by a second bit line contact, and
the sizes of said first and second bit line contacts are made different from each other, thereby making the value of the resistance present on the path between said second capacitor and said second bit line different from the value of the resistance present on the path between said first capacitor and said first bit line in said first memory cell array.

20. A semiconductor integrated circuit comprising:
a first memory circuit configured to have a first memory cell array having a plurality of memory cells each including a first MOS transistor and a first capacitor, and have a first potential generating circuit which generates at least one potential used to operate said plurality of memory cells in said first memory cell array, said first memory circuit being formed in a semiconductor chip; and
at least one second memory circuit configured to have a second memory cell array having a plurality of memory cells each including a second MOS transistor and a second capacitor having a capacitance different from that of said first capacitor, and have a second potential generating circuit which generates at least one potential used to operate said plurality of memory cells in said second memory cell array, said at least one second memory circuit being formed in the same semiconductor chip as said first memory circuit.

21. A circuit according to claim 20, further comprising a logic circuit configured to connect to said first and second memory circuits to exchange data with said first and second memory circuits.

22. A circuit according to claim 20, wherein each of said first and second memory circuits is one of a DRAM circuit, a ferroelectric memory circuit, and a magnetic memory circuit.

23. A circuit according to claim 20, wherein each of said first and second capacitors has an insulating film sandwiched between a pair of conductor layers, and the capacitances of said first and second capacitors are made different from each other by making the effective film thicknesses of said insulating films of said first and second capacitors different from each other.

24. A circuit according to claim 20, wherein the capacitances of said first and second capacitors are made different from each other by making the effective areas of said first and second capacitors different from each other.

25. A circuit according to claim 20, wherein each of said first and second capacitors has a dielectric film sandwiched between a pair of conductor layers, and the capacitances of said first and second capacitors are made different from each other by making the effective dielectric constants of said dielectric films of said first and second capacitors different from each other.

26. A semiconductor integrated circuit comprising:
a first memory circuit configured to have a first memory cell array having a plurality of memory cells each including a first MOS transistor having a gate electrode, a first driving circuit which supplies to the gate electrode of said first MOS transistor a first potential to turn on said first MOS transistor, and have a first potential generating circuit connected to said first driving circuit to generate a plurality of potentials, including the first potential, used to operate said plurality of memory cells in said first memory cell array, said first memory circuit being formed in a semiconductor chip; and
at least one second memory circuit configured to have a second memory cell array having a plurality of memory cells each including a second MOS transistor having a gate electrode, a second driving circuit which supplies to the gate electrode of said second MOS transistor a second potential, different from the first potential, to turn on said second MOS transistor, and have a second potential generating circuit connected to said second driving circuit to generate a plurality of potentials, including the second potential, used to operate said plurality of memory cells in said second memory cell array, said at least one second memory circuit being formed in the same semiconductor chip as said first memory circuit.

27. A circuit according to claim 26, further comprising a logic circuit configured to connect to said first and second memory circuits to exchange data with said first and second memory circuits.

28. A circuit according to claim 26, wherein each of said first and second memory circuits is one of a DRAM circuit, an SRAM circuit, a nonvolatile memory such as a flash memory, a ferroelectric memory circuit, and a magnetic memory circuit.

29. A circuit according to claim 26, wherein each of said first and second potential generating circuits is a word line driving potential generating circuit.

30. A semiconductor integrated circuit comprising:
a first memory circuit configured to have a first memory cell array having a plurality of memory cells each including a first MOS transistor having a gate electrode, a first driving circuit which supplies, to the gate electrode of said first MOS transistor of a memory cell which is not selected, a first potential to turn off said first MOS transistor, and have a first potential generating circuit connected to said first driving circuit to generate a plurality of potentials, including the first potential, used to operate said plurality of memory cells in said first memory cell array, said first memory circuit being formed in a semiconductor chip; and
at least one second memory circuit configured to have a second memory cell array having a plurality of memory cells each including a second MOS transistor having a gate electrode, a second driving circuit which supplies, to the gate electrode of said second MOS transistor of a memory cell which is not selected, a second potential, different from the first potential, to turn off said second MOS transistor, and have a second potential generating circuit connected to said second driving circuit to generate a plurality of potentials, including the second potential, used to operate said plurality of memory cells in said second memory cell array, said at least one second memory circuit being formed in the same semiconductor chip as said first memory circuit.

31. A circuit according to claim 30, further comprising a logic circuit configured to connect to said first and second memory circuits to exchange data with said first and second memory circuits.

32. A circuit according to claim 30, wherein each of said first and second memory circuits is one of a DRAM circuit, an SRAM circuit, a nonvolatile memory such as a flash memory, a ferroelectric memory circuit, and a magnetic memory circuit.

33. A circuit according to claim 30, wherein each of said first and second driving circuits is a word line driving potential generating circuit.

34. A circuit according to claim 33, wherein said word line driving potential generating circuit generates a negative potential.

35. A semiconductor integrated circuit comprising:
- a first memory circuit configured to have a first memory cell array in which a plurality of memory cells each including a MOS transistor are formed in a first well region to which a first potential is supplied, and have a first potential generating circuit which generates a plurality of potentials, including the first potential, used to operate said plurality of memory cells in said first memory cell array, said first memory circuit being formed in a semiconductor chip; and
- at least one second memory circuit configured to have a second memory cell array in which a plurality of memory cells each including a MOS transistor are formed in a second well region to which a second potential different from the first potential is supplied, and have a second potential generating circuit which generates a plurality of potentials, including the second potential, used to operate said plurality of memory cells in said second memory cell array, said at least one second memory circuit being formed in the same semiconductor chip as said first memory circuit.

36. A circuit according to claim 35, further comprising a logic circuit configured to connect to said first and second memory circuits to exchange data with said first and second memory circuits.

37. A circuit according to claim 35, wherein each of said first and second memory circuits is one of a DRAM circuit, an SRAM circuit, a nonvolatile memory such as a flash memory, a ferroelectric memory circuit, and a magnetic memory circuit.

38. A circuit according to claim 35, wherein each of said first and second potential generating circuits is a well potential generating circuit.

39. A circuit according to claim 38, wherein said well potential generating circuit generates a negative potential.

40. A semiconductor integrated circuit comprising:
- a first memory circuit configured to have a first memory cell array having a plurality of memory cells connected to a first bit line, and have a first potential generating circuit connected to said first memory cell array to generate a plurality of potentials which include a first potential supplied to said first bit line when data is to be read out from said first memory cell array, and which are used to operate said plurality of memory cells in said first memory cell array, said first memory circuit being formed in a semiconductor chip; and
- at least one second memory circuit configured to have a second memory cell array having a plurality of memory cells connected to a second bit line, and have a second potential generating circuit connected to said second memory cell array to generate a plurality of potentials which include a second potential different from the first potential and supplied to said second bit line when data is to be read out from said second memory cell array, and which are used to operate said plurality of memory cells in said second memory cell array, said at least one second memory circuit being formed in the same semiconductor chip as said first memory circuit.

41. A circuit according to claim 40, further comprising a logic circuit configured to connect to said first and second memory circuits to exchange data with said first and second memory circuits.

42. A circuit according to claim 40, wherein each of said first and second memory circuits is one of a DRAM circuit, an SRAM circuit, a nonvolatile memory such as a flash memory, a ferroelectric memory circuit, and a magnetic memory circuit.

43. A circuit according to claim 40, wherein each of said first and second potential generating circuits is a bit line driving potential generating circuit.

44. A circuit according to claim 43, wherein said bit line driving potential generating circuit generates a positive potential lower than a power supply potential.

45. A semiconductor integrated circuit comprising:
- a first memory circuit configured to have a first memory cell array having a plurality of memory cells each including a MOS transistor, and each of said plurality of memory cells is connected to a first bit line via a self-aligned contact portion, and have a first potential generating circuit which generates at least one potential used to operate said plurality of memory cells in said first memory cell array, said first memory circuit being formed in a semiconductor chip; and
- at least one second memory circuit configured to have a second memory cell array having a plurality of memory cells each including a MOS transistor, and each of said plurality of memory cells is connected to a second bit line via a contact portion having no self-aligned structure, and have a second potential generating circuit which generates at least one potential used to operate said plurality of memory cells in said second memory cell array, said at least one second memory circuit being formed in the same semiconductor chip as said first memory circuit.

46. A circuit according to claim 45, further comprising a logic circuit configured to connect to said first and second memory circuits to exchange data with said first and second memory circuits.

47. A circuit according to claim 45, wherein each of said first and second memory circuits is one of a DRAM circuit, an SRAM circuit, a nonvolatile memory such as a flash memory, a ferroelectric memory circuit, and a magnetic memory circuit.

48. A semiconductor integrated circuit comprising:
- a first memory circuit configured to have a first memory cell array having a plurality of memory cells each including a MOS transistor whose gate electrode has a salicide structure, and have a first potential generating circuit which generates at least one potential used to operate said plurality of memory cells in said first memory cell array, said first memory circuit being formed in a semiconductor chip; and
- at least one second memory circuit configured to have a second memory cell array having a plurality of memory cells each including a MOS transistor whose gate electrode has no salicide structure, and have a second potential generating circuit which generates at least one potential used to operate said plurality of memory cells in said second memory cell array, said at least one second memory circuit being formed in the same semiconductor chip as said first memory circuit.

49. A circuit according to claim 48, further comprising a logic circuit configured to connect to said first and second memory circuits to exchange data with said first and second memory circuits.

50. A circuit according to claim 48, wherein each of said first and second memory circuits is one of a DRAM circuit, an SRAM circuit, a nonvolatile memory such as a flash memory, a ferroelectric memory circuit, and a magnetic memory circuit.

51. A semiconductor integrated circuit comprising:
a first memory circuit configured to have a first memory cell array in which a first number of memory cells are connected to a first bit line, and have a first potential generating circuit which generates at least one potential used to operate said plurality of memory cells in said first memory cell array, said first memory circuit being formed in a semiconductor chip; and
at least one second memory circuit configured to have a second memory cell array in which a second number, which is different from the first number, of memory cells are connected to a second bit line, and have a second potential generating circuit which generates at least one potential used to operate said plurality of memory cells in said second memory cell array, said at least one second memory circuit being formed in the same semiconductor chip as said first memory circuit.

52. A circuit according to claim 51, further comprising a logic circuit configured to connect to said first and second memory circuits to exchange data with said first and second memory circuits.

53. A circuit according to claim 51, wherein each of said first and second memory circuits is one of a DRAM circuit, an SRAM circuit, a nonvolatile memory such as a flash memory, a ferroelectric memory circuit, and a magnetic memory circuit.

54. A semiconductor integrated circuit comprising:
a first memory circuit configured to have a first memory cell array in which a first number of memory cells are connected to a first word line, and have a first potential generating circuit which generates at least one potential used to operate said plurality of memory cells in said first memory cell array, said first memory circuit being formed in a semiconductor chip; and
at least one second memory circuit configured to have a second memory cell array in which a second number, which is different from the first number, of memory cells are connected to a second word line, and have a second potential generating circuit which generates at least one potential used to operate said plurality of memory cells in said second memory cell array, said at least one second memory circuit being formed in the same semiconductor chip as said first memory circuit.

55. A circuit according to claim 54, further comprising a logic circuit configured to connect to said first and second memory circuits to exchange data with said first and second memory circuits.

56. A circuit according to claim 54, wherein each of said first and second memory circuits is one of a DRAM circuit, an SRAM circuit, a nonvolatile memory such as a flash memory, a ferroelectric memory circuit, and a magnetic memory circuit.

57. A semiconductor integrated circuit comprising:
a first memory circuit configured to have a first memory cell array having a bit line which has a twisted bit line structure and to which a plurality of memory cells are connected, and have a first potential generating circuit which generates at least one potential used to operate said plurality of memory cells in said first memory cell array, said first memory circuit being formed in a semiconductor chip; and
at least one second memory circuit configured to have a second memory cell array having a bit line which has a structure other than a twisted bit line structure and to which a plurality of memory cells are connected, and have a second potential generating circuit which generates at least one potential used to operate said plurality of memory cells in said second memory cell array, said at least one second memory circuit being formed in the same semiconductor chip as said first memory circuit.

58. A circuit according to claim 57, further comprising a logic circuit configured to connect to said first and second memory circuits to exchange data with said first and second memory circuits.

59. A circuit according to claim 57, wherein each of said first and second memory circuits is one of a DRAM circuit, an SRAM circuit, a nonvolatile memory such as a flash memory, a ferroelectric memory circuit, and a magnetic memory circuit.

60. A semiconductor integrated circuit comprising:
a first memory circuit configured to have a first memory cell array having a bit line pair which has a first twisted bit line structure and to which a plurality of memory cells are connected, and have a first potential generating circuit which generates at least one potential used to operate said plurality of memory cells in said first memory cell array, said first memory circuit being formed in a semiconductor chip; and
at least one second memory circuit configured to have a second memory cell array having a bit line pair which has a second twisted bit line structure and to which a plurality of memory cells are connected, and have a second potential generating circuit which generates at least one potential used to operate said plurality of memory cells in said second memory cell array, said at least one second memory circuit being formed in the same semiconductor chip as said first memory circuit.

61. A circuit according to claim 60, further comprising a logic circuit configured to connect to said first and second memory circuits to exchange data with said first and second memory circuits.

62. A circuit according to claim 60, wherein each of said first and second memory circuits is one of a DRAM circuit, an SRAM circuit, a nonvolatile memory such as a flash memory, a ferroelectric memory circuit, and a magnetic memory circuit.

63. A circuit according to claim 60, wherein
the first twisted bit line structure have bit lines which are twisted in all bit line pairs, and
the second twisted bit line structure have bit lines which are twisted in every other bit line pair.

64. A semiconductor integrated circuit comprising:
a first memory circuit configured to have a first memory cell array having a plurality of memory cells requiring a refresh operation, a first refresh control circuit connected to said first memory cell array to perform control such that a refresh operation of said plurality of memory cells in said first memory cell array is performed at a first period, and have a first potential generating circuit which generates at least one potential used to operate said plurality of memory cells in said first memory cell array, said first memory circuit being formed in a semiconductor chip; and at least one second memory circuit configured to have a second memory cell array having a plurality of memory cells requiring a refresh operation, a second refresh control circuit connected to said second memory cell array to perform control such that a refresh operation of said plurality of memory cells in said second memory cell array is performed at a second period different from the first period, and have a second potential generating circuit which generates at least one potential used to operate said plurality of memory cells in said second memory cell array, said at least one second memory circuit being formed in the same semiconductor chip as said first memory circuit.

65. A circuit according to claim 64, further comprising a logic circuit configured to connect to said first and second memory circuits to exchange data with said first and second memory circuits.

66. A circuit according to claim 64, wherein each of said first and second memory circuits is one of a DRAM circuit, an SRAM circuit, a nonvolatile memory such as a flash memory, a ferroelectric memory circuit, and a magnetic memory circuit.

67. A circuit according to claim 64, wherein each of said first and second refresh control circuits includes a refresh timer which outputs a timer signal having a predetermined period, and a refresh address counter which counts the timer signal, and the periods of the timer signals output from said refresh timers in said first and second refresh control circuits are different from each other.

68. A semiconductor integrated circuit comprising:

a first memory circuit configured to have a first memory cell array having a plurality of memory cells and a first random access time, and have a first potential generating circuit which generates at least one potential used to operate said plurality of memory cells in said first memory cell array, said first memory circuit being formed in a semiconductor chip; and at least one second memory circuit configured to have a second memory cell array having a plurality of memory cells and a second random access time different from the first random access time, and have a second potential generating circuit which generates at least one potential used to operate said plurality of memory cells in said second memory cell array, said at least one second memory circuit being formed in the same semiconductor chip as said first memory circuit.

69. A circuit according to claim 68, further comprising a logic circuit configured to connect to said first and second memory circuits to exchange data with said first and second memory circuits.

70. A circuit according to claim 68, wherein each of said first and second memory circuits is one of a DRAM circuit, an SRAM circuit, a nonvolatile memory such as a flash memory, a ferroelectric memory circuit, and a magnetic memory circuit.

* * * * *